US010824077B2

(12) United States Patent
Shimizu et al.

(10) Patent No.: US 10,824,077 B2
(45) Date of Patent: Nov. 3, 2020

(54) EXPOSURE DEVICE

(71) Applicant: ADVANTEST CORPORATION, Tokyo (JP)

(72) Inventors: Youichi Shimizu, Tochigi (JP); Hitoshi Tanaka, Tochigi (JP)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 16/498,394

(22) PCT Filed: Apr. 11, 2017

(86) PCT No.: PCT/JP2017/014879
§ 371 (c)(1),
(2) Date: Sep. 27, 2019

(87) PCT Pub. No.: WO2018/189816
PCT Pub. Date: Oct. 18, 2018

(65) Prior Publication Data
US 2020/0064743 A1    Feb. 27, 2020

(51) Int. Cl.
*G03F 7/20*       (2006.01)
*H01J 37/18*      (2006.01)
*H01J 37/317*     (2006.01)

(52) U.S. Cl.
CPC ........ *G03F 7/70016* (2013.01); *G03F 7/7015* (2013.01); *H01J 37/18* (2013.01); *H01J 37/3177* (2013.01); *H01J 2237/31793* (2013.01)

(58) Field of Classification Search
USPC ...................................... 250/492.22, 492.23
See application file for complete search history.

(56) References Cited

U.S. PATENT DOCUMENTS

2013/0134322 A1    5/2013  Yasuda
2014/0106268 A1    4/2014  Imaoka
(Continued)

FOREIGN PATENT DOCUMENTS

JP       2002118054 A     4/2002
JP       2002352763 A    12/2002
(Continued)

OTHER PUBLICATIONS

International Search Report and (ISA/237) Written Opinion of the International Search Authority for International Patent Application No. PCT/JP2017/014879, mailed by the Japan Patent Office dated Jul. 11, 2017.

*Primary Examiner* — Kiet T Nguyen

(57) ABSTRACT

An exposure device is provided, including: a body tube depressurized to produce a vacuum state therein; a plurality of charged particle beam sources that are provided in the body tube, and emit a plurality of charged particle beams in a direction of extension of the body tube; a plurality of electromagnetic optical elements, each being corresponding to one of the plurality of charged particle beams in the body tube, and controls the one of the plurality of charged particle beams; first and second partition walls that are arranged separately from each other in the direction of extension in the body tube, and form non-vacuum spaces between at least parts of the first and second partition walls; and a depressurization pump that depressurizes a non-vacuum space that contacts the first partition wall and a non-vacuum space that contacts the second partition wall to an air pressure between zero and atmospheric pressure.

19 Claims, 12 Drawing Sheets

(56) References Cited

U.S. PATENT DOCUMENTS

| | | | |
|---|---|---|---|
| 2015/0014530 A1 | 1/2015 | Ominami | |
| 2017/0323760 A1* | 11/2017 | Kurokawa | H01J 37/3177 |
| 2017/0330739 A1* | 11/2017 | Hosaka | G01N 27/62 |
| 2019/0198293 A1* | 6/2019 | Ogasawara | H01J 37/06 |

FOREIGN PATENT DOCUMENTS

| | | |
|---|---|---|
| JP | 2005064097 A | 3/2005 |
| JP | 2006054240 A | 2/2006 |
| JP | 2012151102 A | 8/2012 |

\* cited by examiner

EXPOSURE DEVICE

CROSS-REFERENCE TO RELATED APPLICATIONS

This application is a National Stage entry of International Patent Application No. PCT/JP2017/014879 filed on Apr. 11, 2017, the contents of which are hereby incorporated by reference in its entirety.

BACKGROUND

1. Technical Field

The present invention relates to an exposure device.

2. Related Art

There are known conventional exposure techniques to draw circuit patterns on a semiconductor wafer by using electron beam exposure devices. In addition, there are also known multi-beam exposure techniques to improve throughput by generating a plurality of electron beams, and drawing circuit patterns on a semiconductor wafer by using each beam (see Patent Documents 1 to 3, for example).

Patent Document 1: Japanese Patent Application Publication No. 2012-151102
Patent Document 2: WO2012/057166
Patent Document 3: Japanese Patent Application Publication No. 2013-175377

An electron beam exposure device includes a plurality of areas of electronic circuits which operate in an atmospheric pressure environment, and a plurality of vacuum areas where electron beams are generated, accelerated and concentrated. A multi-beam exposure device has a complicated configuration since a plurality of atmospheric pressure areas and a plurality of vacuum areas are arranged close to each other. Accordingly, even if the multi-beam exposure device is assembled highly precisely at atmospheric pressure, in some cases, formation of the vacuum areas by vacuum exhaustion inadvertently causes deformation of partition walls separating the atmospheric pressure areas from the vacuum areas, and inadvertently changes some or all of the optical systems of a plurality of electron beams separately and independently in a complicated manner. In addition, such deformation of the partition walls also inadvertently generates vacuum leakages in some cases.

SUMMARY (Item 1)

An exposure device may include a body tube that is depressurized to produce a vacuum state therein.

The exposure device may include a plurality of charged particle beam sources that are provided in the body tube, and emit a plurality of charged particle beams in a direction of extension of the body tube.

The exposure device may include a plurality of electromagnetic optical elements, each of which is provided corresponding to one of the plurality of charged particle beams in the body tube, and controls the one of the plurality of charged particle beams.

The exposure device may include a first partition wall and a second partition wall that are arranged separately from each other in the direction of extension in the body tube, and form non-vacuum spaces between at least parts of the first partition wall and the second partition wall.

The exposure device may include a depressurization pump that depressurizes a non-vacuum space that contacts the first partition wall and a non-vacuum space that contacts the second partition wall to an air pressure between zero and atmospheric pressure.

(Item 2)

The first partition wall may have openings, each of which corresponds to one of the plurality of charged particle beams, and is for allowing passage therethrough of an electron beam.

The second partition wall may have openings, each of which corresponds to one of the plurality of charged particle beams, and is for allowing passage therethrough of an electron beam.

(Item 3)

The plurality of electromagnetic optical elements may be provided in a depressurized space which is between the first partition wall and the second partition wall and is depressurized by the depressurization pump.

(Item 4)

The plurality of electromagnetic optical elements and a surface of the first partition wall at which the first partition wall contacts the depressurized space may be sealed together by vacuum seals. The plurality of electromagnetic optical elements and a surface of the second partition wall at which the second partition wall contacts the depressurized space may be sealed together by vacuum seals.

(Item 5)

The exposure device may include a third partition wall provided between the first partition wall and the second partition wall.

The exposure device may include a fourth partition wall provided between the third partition wall and the second partition wall.

At least a partial space between the third partition wall and the fourth partition wall may have an air pressure higher than air pressures of a space between the first partition wall and the third partition wall and a space between the second partition wall and the fourth partition wall.

(Item 6)

The first partition wall and the second partition wall may be fixed to each other at a plurality of locations other than edge portions.

(Item 7)

An exposure device may include a body tube that is depressurized to produce a vacuum state therein.

The exposure device may include a plurality of charged particle beam sources that are provided in the body tube, and emit a plurality of charged particle beams in a direction of extension of the body tube.

The exposure device may include a plurality of electromagnetic optical elements, each of which is provided corresponding to one of the plurality of charged particle beams in the body tube, and controls the one of the plurality of charged particle beams.

The exposure device may include a first partition wall and a second partition wall that are arranged separately from each other in the direction of extension in the body tube, and form non-vacuum spaces between at least parts of the first partition wall and the second partition wall.

The first partition wall and the second partition wall may be fixed to each other at a plurality of locations other than edge portions.

(Item 8)

The exposure device may include a plurality of cylindrical members that are provided corresponding to the plurality of charged particle beams, and penetrate the first partition wall and the second partition wall to allow passage therethrough of corresponding charged particle beams.

The first partition wall and the second partition wall may be pressed by both sides of each of the plurality of cylindrical members.

(Item 9)

A nut may be screwed onto at least one end portion of each of the plurality of cylindrical members.

At least one of the first partition wall and the second partition wall may be pressed by the nut.

(Item 10)

The exposure device may include a plurality of fixation members that penetrate the first partition wall and the second partition wall at a plurality of locations other than edge portions, and press the first partition wall and the second partition wall from both sides.

(Item 11)

Each of the plurality of fixation members may have: a bolt that penetrates the first partition wall and the second partition wall; and a nut screwed onto the bolt.

(Item 12)

The first partition wall and the second partition wall may be screwed onto members provided in a space between the first partition wall and the second partition wall at a plurality of locations other than edge portions.

(Item 13)

The exposure device may include a third partition wall that is arranged separately from the first partition wall in the direction of extension in the body tube, and forms a vacuum space between the third partition wall and the first partition wall.

The first partition wall may be pressed toward the second partition wall by a first reinforcing member that is provided between the first partition wall and the third partition wall, and extends in the direction of extension.

(Item 14)

The plurality of electromagnetic optical elements may be arranged between the first partition wall and the second partition wall.

(Item 15)

An exposure device may include a body tube that is depressurized to produce a vacuum state therein.

The exposure device may include a plurality of charged particle beam sources that are provided in the body tube, and emit a plurality of charged particle beams in a direction of extension of the body tube.

The exposure device may include a plurality of electromagnetic optical elements, each of which is provided corresponding to one of the plurality of charged particle beams in the body tube, and controls the one of the plurality of charged particle beams.

The exposure device may include a first partition wall and a second partition wall that are arranged separately from each other in the direction of extension in the body tube.

The first partition wall and the second partition wall may form at least one non-vacuum space only at a part of a cross-section of the body tube perpendicular to the direction of extension, and form a vacuum space in a remaining portion.

(Item 16)

At least one non-vacuum space may consist of one or more non-vacuum spaces, and each of the plurality of electromagnetic optical elements may be arranged in the one or more non-vacuum spaces formed by the first partition wall and the second partition wall.

(Item 17)

One of the non-vacuum spaces may contact an inner wall of the body tube.

Each of the one or more non-vacuum spaces may be provided with a wire therein that contacts an inner wall of the body tube, and is connected to at least some of the plurality of electromagnetic optical elements.

(Item 18)

Corresponding to each of a plurality of non-vacuum spaces, each of a plurality of the first partition walls facing the second partition wall may be provided in the exposure device.

At a portion of the second partition wall where the plurality of non-vacuum spaces are not formed, the second partition wall may be exposed toward both the plurality of charged particle beam sources and a side opposite to the plurality of charged particle beam sources.

(Item 19)

A plurality of spaces may be provided between the first partition wall and the second partition wall.

Some of the plurality of spaces may be the non-vacuum spaces, and remaining ones of the plurality of spaces may be spaces that communicate with a vacuum space at least one of a side closer to the first partition wall or a side closer to the second partition wall.

(Item 20)

An exposure device may include a body tube that is depressurized to produce a vacuum state therein.

The exposure device may include a plurality of charged particle beam sources that are provided in the body tube, and emit a plurality of charged particle beams in a direction of extension of the body tube.

The exposure device may include a plurality of electromagnetic optical elements, each of which is provided corresponding to one of the plurality of charged particle beams in the body tube, and controls the one of the plurality of charged particle beams.

The exposure device may include a wiring substrate that is provided in the body tube, and has: wires connected to the plurality of electromagnetic optical elements; and openings through which individual ones of the plurality of charged particle beams are allowed to pass.

The exposure device may include a first partition wall pasted onto one surface of the wiring substrate.

The exposure device may include a second partition wall pasted onto a surface of the wiring substrate which is opposite to the surface of the wiring substrate onto which the first partition wall is pasted.

(Item 21)

An exposure device may include a body tube.

The exposure device may include a plurality of charged particle beam sources that are provided in the body tube, and emit a plurality of charged particle beams in a direction of extension of the body tube.

The exposure device may include a stage unit that is provided in the body tube, and on which a sample to be a target of irradiation of the plurality of charged particle beams is placed.

The exposure device may include a plurality of first electromagnetic optical elements that are each provided corresponding to one of the plurality of charged particle beams in the body tube, and each control one charged particle beam.

The exposure device may include a first partition wall and a second partition wall that are arranged in order separately from each other in the direction of extension in the body tube.

The exposure device may include a third partition wall that is arranged separately from the first partition wall and the second partition wall in the direction of extension in the body tube.

The exposure device may include a hollow member that surrounds a partial space through which the plurality of charged particle beams pass between the first partition wall and the third partition wall in the body tube.

The exposure device may include a vacuum pump that exhausts air inside the hollow member to produce a vacuum state.

(Item 22)

The hollow member may have a first end that contacts the first partition wall, and the first partition wall and the first end are sealed together by a vacuum seal.

(Item 23)

The hollow member may have a second end that contacts the third partition wall, and the third partition wall and the second end may be sealed together by a vacuum seal.

(Item 24)

The exposure device may include a plurality of the hollow members each surrounding a space through which one of the plurality of charged particle beams passes. Each of the plurality of hollow members may penetrate the first partition wall, the second partition wall, and the third partition wall.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
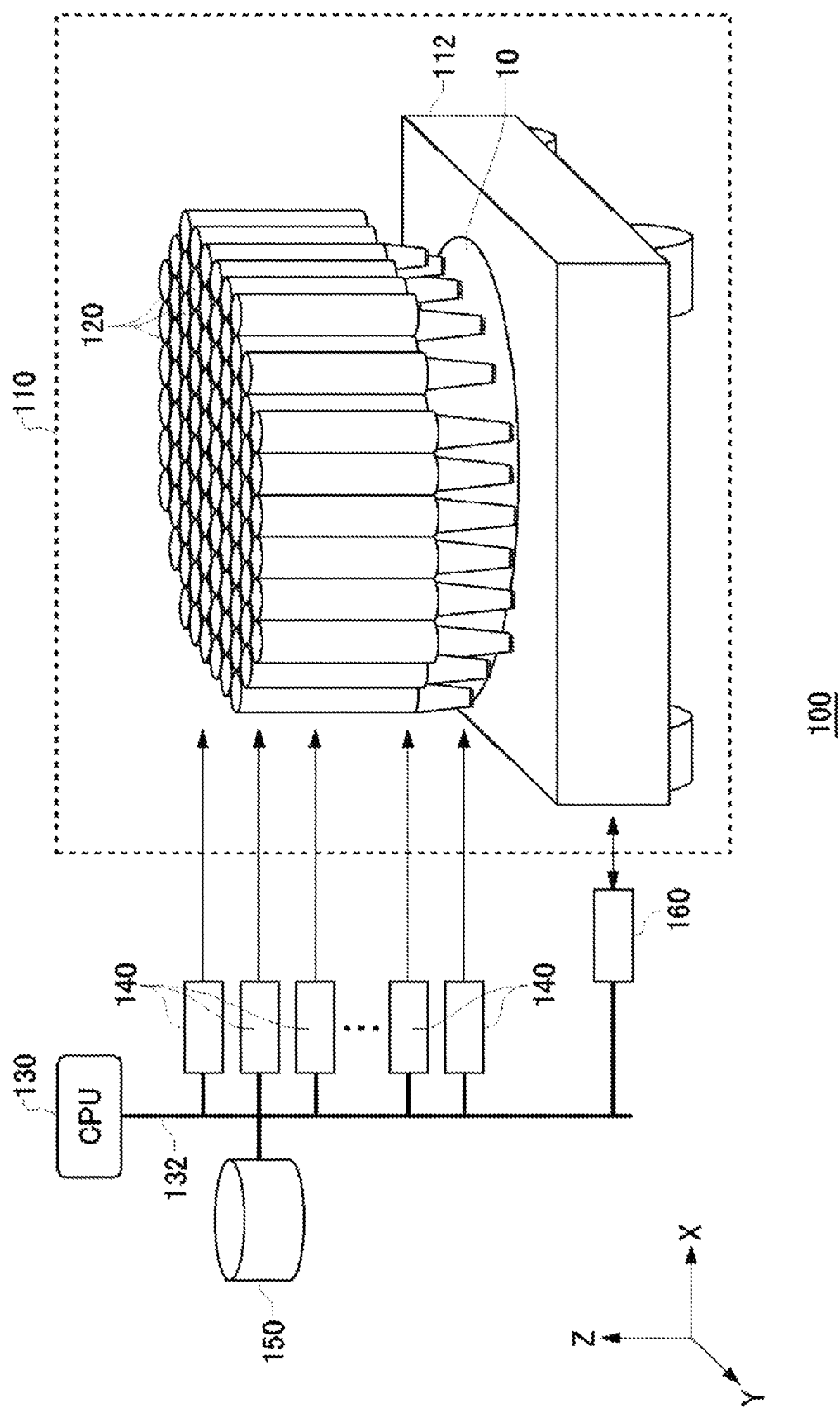
FIG. 1 illustrates an exemplary configuration of an exposure device 100 according to the present embodiment.

FIG. 1 illustrates an exemplary configuration of an exposure device 100 according to the present embodiment. The exposure device 100 generates a plurality of electron beams, and draws circuit patterns or the like on a sample 10 by using each beam. The exposure device 100 includes a body tube 110, a CPU 130, a bus 132, exposure control units 140, a storage unit 150 and a stage control unit 160.

The body tube 110 is depressurized to produce a vacuum state therein. The body tube 110 functions as a multi-electron beam column that generates a plurality of electron beams, and irradiates the sample 10 with the electron beams. That is, the body tube 110 has a plurality of electron beam generating units 120, and a stage unit 112 on which the sample 10 is placed.

Each of the electron beam generating units 120 generates a charged particle beam having electrons, ions or the like, and irradiates the sample 10 placed on the stage unit 112 with the charged particle beam. The present embodiment explained represents an example in which the electron beam generating units 120 generate electron beams. The number of electron beam generating units 120 is desirably as large as possible, and there are desirably several dozen electron beam generating units or more, for example. The number of electron beam generating units 120 is about one hundred, for example. The number of electron beam generating units 120 is 88, for example. In this case, the 88 electron beam generating units 120 may be arranged at pitches of approximately 30 mm on the X-Y plane. The plurality of electron beam generating units 120 are desirably arranged such that they are able to irradiate the entire surface of the sample 10 within the movable range of the stage unit 112.

FIG. 1 illustrates an example in which each of the electron beam generating units 120 generates an electron beam in a direction approximately parallel to the Z-axis direction. Each of the electron beam generating units 120 produces an electron beam with a predetermined shape. For example, the electron beam generating units 120 each produce an electron beam which collectively forms an array-like electron beam in which electron beams are arrayed in a predetermined one-dimensional direction. In this case, the exposure device 100 may expose the sample 10 to a pattern of the plurality of electron beams by switchingly and individually selecting whether to perform irradiation of a surface of the sample 10 with each of the plurality of electron beams (ON-state) or not to perform irradiation of the surface of the sample 10 with the electron beam (OFF-state) while moving the stage unit 112. The electron beam generating units 120 are mentioned below.

The stage unit 112 moves the sample 10 to be a target of irradiation using a plurality of charged particle beams while the sample 10 is placed thereon. Here, the sample 10 may be a substrate formed of a semiconductor, glass, ceramic and/or the like, and for example is a semiconductor wafer formed of silicon or the like. The sample 10 may be a semiconductor wafer with diameter of approximately 300 mm. The sample 10 is a substrate having a surface on which a line pattern is formed with a conductor such as a metal, for example. In this case, the exposure device 100 may expose a resist formed on the line pattern to electron beams in order to make cuts along the line pattern to perform fine machining (formation of an electrode, a wire, a via and/or the like).

The stage unit 112 has the sample 10 mounted thereon, and moves the sample 10 on a predetermined plane. FIG. 1 illustrates an example in which the stage unit 112 moves the sample 10 on a plane approximately parallel to the X-Y plane. The stage unit 112 may be an XY-stage, and may be an XY-stage combined with one or more of a Z-stage, a rotational stage and a tilt stage. The stage unit 112 desirably includes a stage position detecting unit that detects the position of the stage unit 112. For example, the stage position detecting unit detects the position of the stage by irradiating the moving stage with laser light, and detecting reflected light. The stage position detecting unit desirably detect the position of the stage with precision of approximately 1 nm or smaller.

The CPU 130 controls the overall operation of the exposure device 100. The CPU 130 may have the function of an input terminal through which a manipulation instruction from a user is input. The CPU 130 may be a computer, a workstation, or the like. The CPU 130 may be connected to the exposure control units 140, and control exposure operations of the exposure device 100 according to user input. For example, the CPU 130 is connected to each of the exposure control units 140, the storage unit 150, and the stage control unit 160 via the bus 132, and exchanges control signals or the like with them.

A plurality of exposure control units 140 are provided, each of which is connected to a corresponding electron beam generating unit 120. Each of the exposure control units 140 controls a corresponding electron beam generating unit 120 to execute an exposure operation on the sample 10 according to a control signal received from the CPU 130, or the like. In addition, the exposure control units 140 may be connected to the storage unit 150 via the bus 132, and exchange data of patterns stored in the storage unit 150, or the like.

The storage unit 150 stores patterns that the exposure device 100 uses for exposure. For example, the storage unit 150 stores a cut pattern that the exposure device 100 uses for exposure in order to make cuts on the sample 10 along a line pattern formed thereon. In addition, the storage unit 150 may store a via pattern that the exposure device 100 uses for exposure in order to form vias on the sample 10. For example, the storage unit 150 receives information about cut patterns and via patterns from the outside via a network or the like, and stores them. In addition, the storage unit 150 may receive information about cut patterns and via patterns input by a user via the CPU 130, and stores them.

In addition, the storage unit 150 may store arrangement information about the sample 10, and information about a line pattern formed on the sample 10. Before starting an exposure operation, the storage unit 150 may store, as arrangement information, a measurement result obtained through measurement performed in advance. For example, the storage unit 150 may store, as arrangement information about the sample 10, information that become causes of positioning errors such as shrinkage ratios (deformation errors due to manufacturing processes) of the sample 10, rotational errors due to transfer or the like, distortion of substrates or the like, and height distribution.

In addition, the storage unit 150 may store, as line pattern arrangement information, information related to positional discrepancies between the irradiation positions of a plurality of electron beams and the position of a line pattern. The storage unit 150 desirably treats, as arrangement information, arrangement information about the sample 10 and line pattern arrangement information that are acquired by performing measurement of the sample 10 placed on the stage unit 112. Instead of this, the storage unit 150 may store past measurement results about the sample 10, measurement results of other samples in the same lot, or the like.

The stage control unit 160 is connected to the stage unit 112, and controls operations of the stage unit 112. According to control signals received from the CPU 130, or the like, the stage control unit 160 moves the stage unit 112, and controls the positions on the sample 10 that are irradiated by the electron beam generating units 120. For example, the stage control unit 160 moves the irradiation positions of a plurality of electron beams along the longitudinal direction of a line pattern of the sample 10.

The stage control unit 160 in the present embodiment may move the stage unit 112 on which the sample 10 is mounted approximately in parallel to the X-direction to thereby move the irradiation positions of a plurality of electron beams along the longitudinal direction of a line pattern. In addition, the stage control unit 160 may move the irradiation positions of a plurality of electron beams also in the width direction of a line pattern to move the irradiation positions of the plurality of electron beams so as to make predetermined areas on a surface of the sample 10 areas that can be irradiated by individual electron beams.

In the exposure device 100 according to the present embodiment mentioned above, the plurality of electron beam generating units 120 expose the entire surface of the sample 10 to electron beams. The plurality of electron beam generating units 120 may execute exposure operations temporally in parallel. Individual ones of the electron beam generating units 120 may be able to separately and independently expose predetermined areas on a surface of the sample 10 to electron beams. Thereby, for example, the exposure device 100 can expose 88 areas each with an area of 30 mm×30 mm on a surface of the sample 10 to electron beams in a period during which one electron beam generating unit 120 exposes a square area with an area of 30 mm×30 mm to an electron beam.

In this manner, the exposure device 100 according to the present embodiment can improve the throughput of exposure about several dozen times to a hundred times as compared with an exposure device having a single electron beam generating unit. In this manner, the exposure device 100 can adjust the throughput of exposure by increasing or reducing the number of electron beam generating units 120. Accordingly, even if the sample 10 is a semiconductor wafer or the like having a diameter larger than 300 mm, the exposure device 100 can prevent deterioration of throughput by further increasing the number of electron beam generating units 120. In addition, if the diameters of electron beam generating units 120 can be reduced further, the exposure device 100 may have a still higher throughput by having more densely arranged electron beam generating units 120.

The body tube 110 of such an exposure device 100 includes therein a plurality of areas of electronic circuits which operate in an environment approximately the same as an atmospheric pressure environment, and a plurality of vacuum areas where electron beams are generated, accelerated and concentrated. The inner space of such a body tube 110 is explained next.

Figure 2:
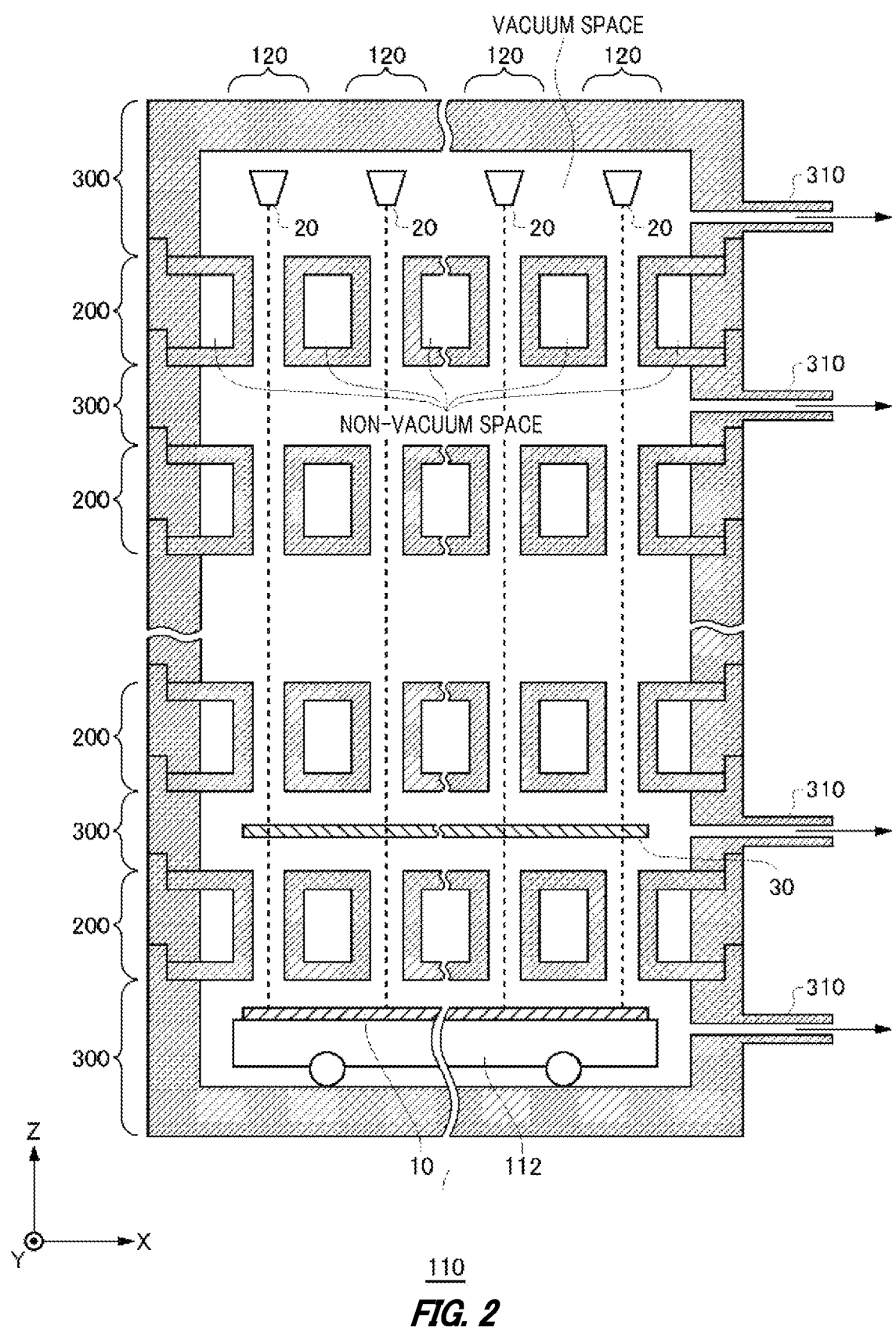
FIG. 2 illustrates an exemplary configuration of a body tube 110 according to the present embodiment.

FIG. 2 illustrates an exemplary configuration of the body tube 110 according to the present embodiment. FIG. 2 illustrates an exemplary cross-sectional view of the body tube 110 which extends approximately in parallel to the Z-axis direction, taken along a plane approximately parallel to the Z-X-plane. As explained with reference FIG. 1 also, the body tube 110 is provided with the stage unit 112 therein on which the sample 10 is placed, and uses a plurality of electron beams to draw a drawing pattern on the sample 10. The body tube 110 includes a plurality of charged particle beam sources 20, a blanking unit 30, first units 200, second units 300, and exhausting openings 310.

The plurality of charged particle beam sources 20 are provided in the body tube 110, and emit a plurality of charged particle beams in a direction of extension of the body tube 110. Each of the charged particle beam sources 20 is an electron gun that emits electrons by means of an electrical field or heat, for example. In this case, the charged particle beam source 20 may apply a predetermined electrical field to emitted electrons to output an electron beam accelerated toward the sample 10 in the −Z-direction in FIG. 1. The charged particle beam source 20 may apply a predetermined accelerating voltage (e.g., 50 kV) to output an electron beam. Note that in the present embodiment explained, electron beams are used as an example of charged particle beams.

The charged particle beam sources 20 may each be provided on a perpendicular line that extends from the surface of the sample 10 approximately parallel to the X-Y plane, and is parallel to the Z axis. That is, the plurality of charged particle beam sources 20 may be arrayed at predetermined intervals approximately in parallel to the X-Y plane. The plurality of charged particle beam sources 20 may be arrayed in a grid or concentrically. An approximately constant accelerating voltage may be applied to the plurality of charged particle beam sources 20.

In this case, the plurality of charged particle beam sources 20 may not be housed individually inside partition walls or the like. Since the body tube 110 does not have to have a body tube formed for each charged particle beam source 20 as illustrated in FIG. 1, the plurality of charged particle beam sources 20 can be arranged more densely. For example, the arrangement intervals of the plurality of charged particle beam sources 20 in one direction within the body tube 110 can be set to about 30 mm. That is, a cylindrical area inside the body tube 110 which includes a charged particle beam source 20, and extends approximately in parallel to the Z-direction is equivalent to an electron beam generating unit 120. In this case, the diameter of the cylindrical area is about 30 mm, for example.

The blanking unit 30 switches whether to or not to irradiate the sample 10 with each of the plurality of charged particle beams. That is, the blanking unit 30 switches whether to or not to deflect each of the electron beams in a direction different from the direction of the sample 10. The blanking unit 30 may have: a plurality of openings each arrayed corresponding to one of the electron beams; and a plurality of blanking electrodes that apply electrical fields into the plurality of openings.

The plurality of openings may allow the passage of individual ones of the electron beams therethrough individually. For example, since if a voltage is not supplied to a blanking electrode, no electrical fields to be applied to an electron beam are generated in a corresponding opening, the electron beam entering the opening is not deflected, but passes through the opening toward the sample 10 (this state is called the beam ON-state). In addition, since if a voltage is supplied to the blanking electrode, an electrical field is generated in the corresponding opening, the electron beam entering the opening is deflected in a direction different from the direction in which the electron beam advances when it passes through the opening toward the sample 10 (this state is called the beam OFF-state). The voltage to switch the state of an electron beam between the ON-state and the OFF-state may be supplied from a corresponding exposure control unit 140 to a blanking electrode.

Here, the space in which an electron beam travels from a charged particle beam source 20 until it reaches the sample 10 via the blanking unit 30 is desirably kept at a predetermined degree of vacuum. In addition, an electromagnetic optical element that causes acceleration, concentration, deflection or the like of an electron beam is provided along the space in which the electron beam travels. Since the electromagnetic optical element includes a coil or the like to generate a flow of current, it is desirably provided in a space which is at about atmospheric pressure.

Since the body tube 110 generates a plurality of electron beams, and irradiates the sample 10 with the plurality of electron beams separately and independently, a plurality of such vacuum areas and non-vacuum areas are provided. Note that the vacuum areas are kept at a degree of vacuum which allows drawing by using electron beams. The vacuum areas are kept at a high degree of vacuum which is $10^{-7}$ Pa to $10^{-8}$ Pa, for example. In addition, the non-vacuum areas may be at about 1 atm. In addition, the non-vacuum areas may be areas at a low degree of vacuum lower than atmospheric pressure provided that the low degree is within a range of degrees of vacuum that allow normal operation of electronic circuits in the body tube 110. That is, the non-vacuum areas may be kept at 100 Pa or higher, for example.

In order to form such a body tube 110 easily, the body tube 110 according to the present embodiment may be constituted by a plurality of separate units, and unit-by-unit formation and adjustment may be possible. The plurality of units may be stacked one on another in the direction of extension of the body tube 110. The body tube 110 includes a plurality of first units 200, and a plurality of second units 300, for example.

A first unit 200 has a vacuum space which serves as a vacuum area during operation of the exposure device, and a non-vacuum space which serves as a non-vacuum area during the operation. The first unit 200 allows the passage of an electron beam through the vacuum space, and is provided with an electromagnetic optical element in the non-vacuum space. The first unit 200 is provided with a partition wall or the like between the vacuum space and the non-vacuum space, and is thereby separated to form those two spaces. Note that the non-vacuum space formed in each of the first units 200 may form an integrated space, or, instead of this, may together form a plurality of spaces.

A second unit 300 has a vacuum space which serves as a vacuum area during operation of the exposure device. The vacuum spaces of individual ones of the plurality of first units 200 and the plurality of second units 300 may form an integrated space. In this case, the integrated space may serve as an area through which electron beams are allowed to pass, an area where the charged particle beam sources 20, blanking unit 30, stage unit 112 and the like, are housed, or the like.

That is, the second units 300 do not have blocking objects arranged between a plurality of charged particle beams that pass through the second units 300. The second units 300 may be hollow units. The second units 300 have exhausting openings 310, and are connected to an exhausting device such as an external vacuum pump. All the second units 300 may have exhausting openings 310, or, instead of this, some of the second units 300 may have exhausting openings 310.

The body tube 110 mentioned above may have the first units 200 and the second units 300 that are stacked one on another alternately. For example, a first unit 200 provided with an electromagnetic optical element is provided on a second unit 300 that houses the stage unit 112, and a second unit 300 that houses the blanking unit 30 may be provided on the first unit 200. The body tube 110 may be formed of multiple stages of units that are stacked one on another in this manner. For example, the body tube 110 has about seven or eight first units 200, and about seven or eight second units 300 that are stacked one on another alternately.

Here, the vacuum space of a first unit 200 may not be provided with a partition wall or the like between the vacuum space and the vacuum space of an adjacent second unit 300. That is, the vacuum spaces in the body tube 110 may be formed integrally. In addition, in this case, the vacuum spaces of a plurality of units may form part of the integrally formed vacuum space. In addition, the non-vacuum spaces of first units 200 may form spaces that are independent unit-by-unit in the body tube 110. Such a plurality of units are explained next.

Figure 3:
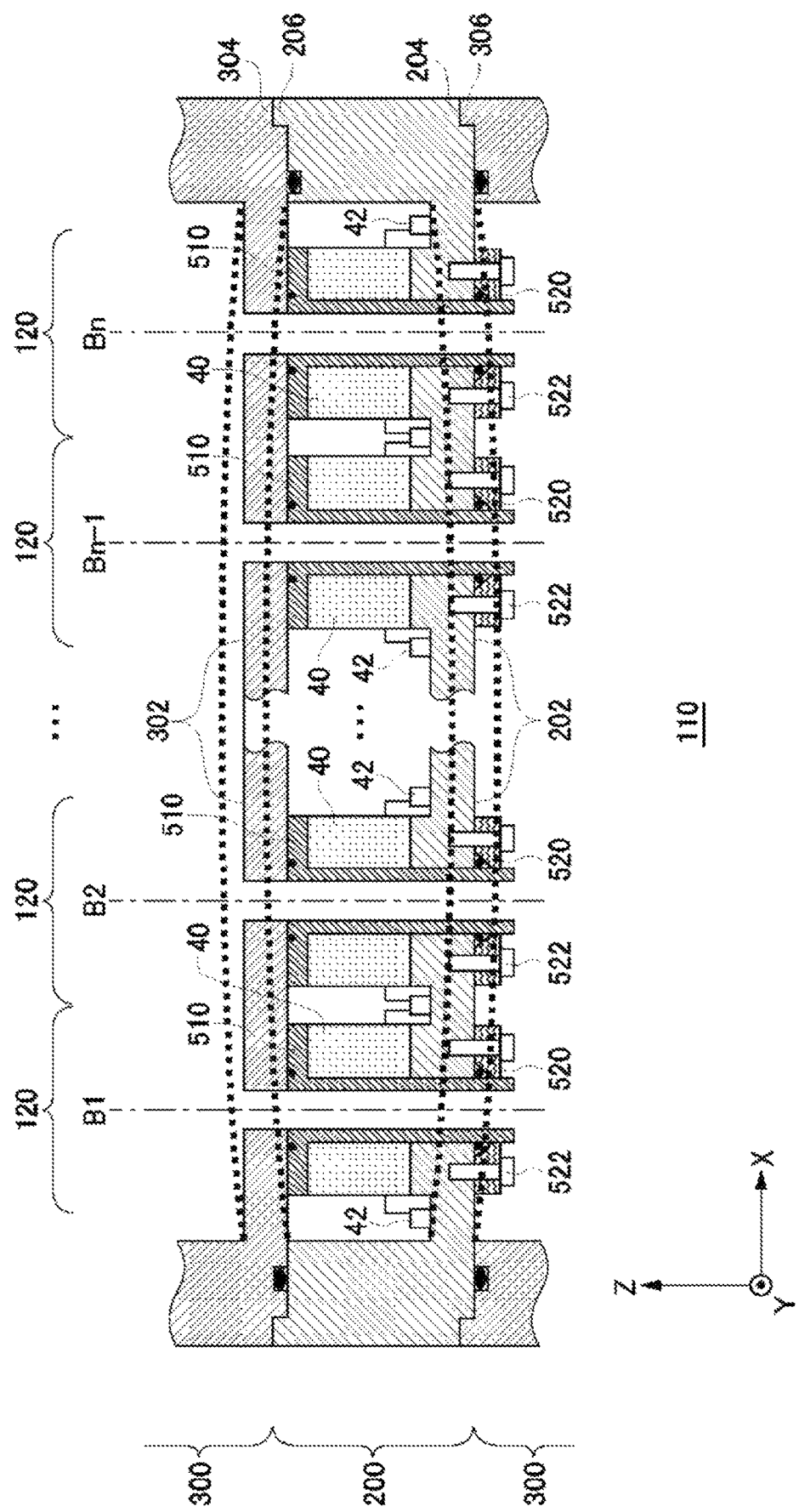
FIG. 3 illustrates an exemplary comparative configuration of a first unit 200 and second units 300 according to the present embodiment.

FIG. 3 illustrates an exemplary comparative configuration of a first unit 200 and second units 300 according to the present embodiment. FIG. 3 illustrates an exemplary cross-sectional view of the body tube 110 taken along a plane approximately parallel to the Z-X-plane. That is, FIG. 3 illustrates an exemplary cross-sectional view showing an enlarged view of part of the cross-sectional view illustrated in FIG. 2. In FIG. 3, exemplary ideal paths of electron beams are indicated by alternate long and short dash lines $B_1$ to $B_n$.

The first unit 200 in the exemplary comparative configuration has a bottom portion 202 on the sample 10 side. In addition, a surface of the bottom portion 202 facing the sample 10 may have a recessed portion 204 formed thereon. In addition, the first unit 200 may have a protruding portion 206 protruding away from the sample 10. Similarly, a second unit 300 in the exemplary comparative configuration has a bottom portion 302 on the sample 10 side. In addition, a surface of the bottom portion 302 facing the sample 10 may have a recessed portion 304 formed thereon. In addition, a second unit 300 may have a protruding portion 306 protruding away from the sample 10.

Such recessed portions and protruding portions of individual units are used for positioning of the units in place when they are stacked one on another. For example, a first unit 200 is stacked on a second unit 300 such that the protruding portion 306 of the second unit 300 mates with the recessed portion 204 of the first unit 200. In addition, a second unit 300 may be stacked on a first unit 200 such that the protruding portion 206 of the first unit 200 mates with the recessed portion 304 of the second unit 300. Note that O-rings or the like may be provided between individual units so as to maintain airtightness therebetween.

FIG. 3 illustrates an example in which recessed portions are provided at bottom portions of individual units, this is not the sole example. It is only required that a shape that allows mating of adjacent units for positioning be formed in one of or both the units. Among a plurality of units that are stacked one on another in this manner, first units 200 having non-vacuum spaces have electromagnetic optical elements 40 arranged therein. That is, a first unit 200 has electromagnetic optical elements 40, wires 42, partition wall portions 510, flanges 520, and fixation screws 522.

A plurality of the partition wall portions 510 are each arranged to surround an ideal path B of an electron beam inside the first unit 200. The plurality of partition wall portions 510 are each fixed to the bottom portion 202 of the first unit 200 and the bottom portion 302 of the second unit 300. For example, the bottom portion 202 has a plurality of through-holes into which the partition wall portions 510 are inserted. The partition wall portions 510 are inserted into the through-holes, and may be fixed by flanges 520 and fixation screws 522 at a surface of the bottom portion 202 facing the sample 10. Note that desirably O-rings are provided between the bottom portion 202, partition wall portions 510, and flanges 520.

Each of the partition wall portions 510 may have a junction interface that is approximately parallel to the X-Y plane, and faces away from the sample 10. Desirably, the partition wall portions 510 are arranged such that, if the second unit 300 is stacked on the first unit 200, the junction interface of each of the partition wall portions 510 comes into contact with a surface of the bottom portion 302 of the second unit 300 facing the sample 10. Note that desirably O-rings are provided between the partition wall portions 510 and the bottom portion 302. The partition wall portions 510 may be formed of a non-magnetic metal. In addition, the partition wall portions 510 may be conductive ceramics or ceramics having a conductive coating formed on an inner circumferential surface thereof.

The electromagnetic optical elements 40 may each be provided to surround such a partition wall portion 510. The electromagnetic optical elements 40 are each provided corresponding to one of a plurality of electron beams to pass through the vacuum areas, and generate magnetic fields to individual electron beams to control them individually. The electromagnetic optical elements 40 include at least one of electromagnetic lenses, electromagnetic deflectors, electromagnetic compensators, and the like, for example. Such electromagnetic optical elements 40 generate magnetic fields, and may execute convergence, deflection, aberration compensation or the like on electron beams.

The electromagnetic optical elements 40 have coils and/or magnetic substances for generating magnetic fields. Since such electromagnetic optical elements 40 cause currents to flow for the purpose of generating magnetic fields, they start firing in some cases if they cannot exhaust heat when arranged in vacuum areas where electron beams pass through. In addition, if the electromagnetic optical elements 40 include coil turns or magnetic substance portions, these members cause degassing due to heat-generation or the like. Accordingly, since if the electromagnetic optical elements 40 are arranged in vacuum areas, they inadvertently cause firing, deterioration of the degree of vacuum and the like in some cases, the electromagnetic optical elements 40 are desirably arranged in non-vacuum spaces formed by the partition wall portions 510 and the like.

The electromagnetic optical elements 40 and partition wall portions 510 are desirably formed axially symmetrically about the ideal paths B of electron beams. For example, the electromagnetic optical elements 40 have coil portions and magnetic substance portions. For example, a coil portion includes turns wound around the central axis. In addition, a magnetic substance portion includes a magnetic substance member that surrounds the coil portion, and is axially symmetric about the central axis, and gaps provided at a part of the magnetic substance member. Such electromagnetic optical elements 40 generate local magnetic fields in the central axis direction in the vacuum areas that are surrounded by the electromagnetic optical elements 40 via the partition wall portions 510. That is, in this case, the electromagnetic optical elements 40 function as electromagnetic lenses that converge electron beams passing through the first unit 200 along paths approximately coinciding with the paths B.

In addition, the electromagnetic optical elements 40 may be have coil portions and/or magnetic substance portions that are arranged axially symmetrically about the paths B.

The electromagnetic optical elements 40 may function as electromagnetic deflectors from which axially asymmetric magnetic fields are generated, and which change the advancing directions of electron beams according to currents flowing through the coil portions. In addition, the electromagnetic optical elements 40 may function as electromagnetic compensators to compensate for aberrations of electron beams. The electromagnetic optical elements 40 may cause currents to flow via the wires 42. The wires 42 are provided in the non-vacuum spaces, and are electrically connected to at least some of the plurality of electromagnetic optical elements 40. The wires 42 are electrically connected to components outside the body tube 110.

The first unit 200 in the exemplary comparative configuration mentioned above is desirably stacked on a second unit after the plurality of partition wall portions 510 are fixed to the bottom portion 202. That is, the first unit 200 may be stacked on the second unit 300 after the inner structure of the first unit 200 is assembled. Then, by still another second unit 300 being stacked on the first unit 200, the vacuum spaces and non-vacuum spaces of the second unit 300 may be formed as illustrated in FIG. 3. That is, the first unit 200 is separated by the first unit 200, second units 300, and plurality of partition wall portions 510 to form two types of spaces, which are vacuum spaces and non-vacuum spaces. Note that the first unit 200 has a plurality of vacuum spaces formed therein corresponding to a plurality of electron beams.

In this manner, the body tube 110 can be formed precisely by executing the assembly and adjustment unit by unit, and stacking the units while positioning each one of them in place. However, even if the body tube 110 is assembled highly precisely at atmospheric pressure, partition walls or the like between non-vacuum areas and vacuum areas deform in some cases if the vacuum areas are formed by vacuum exhaustion through the exhausting openings 310. For example, the bottom portion 202 of the first unit 200 and the bottom portion 302 of the second unit 300 in the exemplary comparative configuration warp toward the vacuum areas as indicated by dotted lines in FIG. 3.

In this case, the partition wall portions 510 and electromagnetic optical elements 40 also move so that some or all of the optical systems of a plurality of electron beams change separately and independently in a complicated manner, and the precision of drawing a pattern on the sample 10 inadvertently lowers in some cases. In addition, such deformation of the bottom portion 202, bottom portion 302 and partition wall portions 510 inadvertently generates vacuum leakages. In view of this, the exposure device 100 according to the present embodiment reduces deformation of partition walls or the like, and reduces variations of the optical system. In addition, the exposure device 100 reduces deformation of the partition walls or the like to thereby prevent occurrences of vacuum leakage. Each unit in a first exemplary configuration that constitutes the body tube 110 of such an exposure device 100 is explained next.

Figure 4:
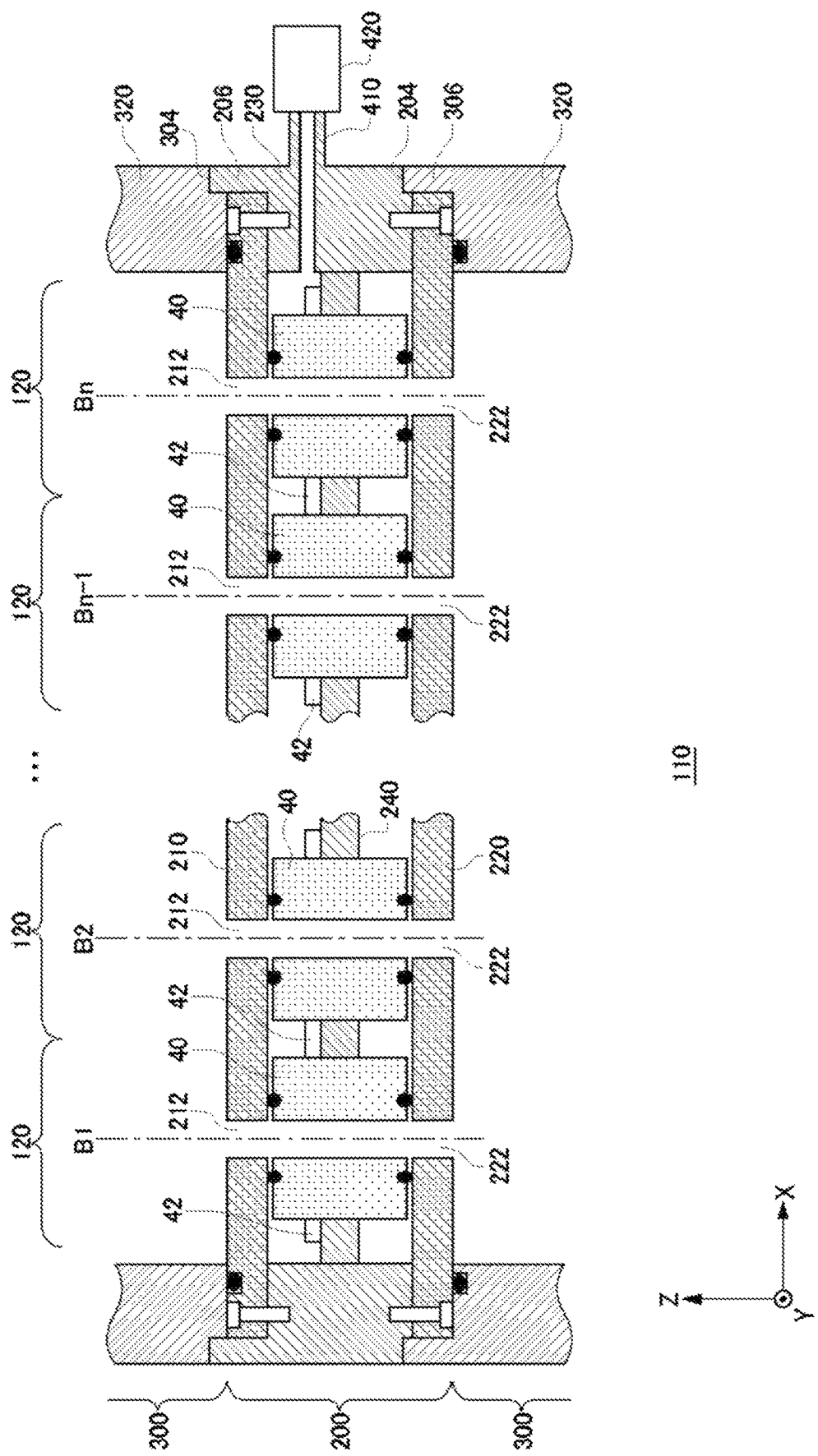
FIG. 4 illustrates a first exemplary configuration of the first unit 200 and second units 300 according to the present embodiment.

FIG. 4 illustrates a first exemplary configuration of the first unit 200 and second units 300 according to the present embodiment. Elements of the first unit 200 and second units 300 in the first exemplary configuration that operate in approximately the same manners as operations of the first unit 200 and second units 300 in the exemplary comparative configuration illustrated in FIG. 3 are given the same symbols, and explanations thereof are omitted. Similar to FIG. 3, FIG. 4 illustrates an exemplary cross-sectional view of the body tube 110 taken along a plane approximately parallel to the Z-X-plane.

Similar to the first unit 200 and second units 300 in the exemplary comparative configuration, the first unit 200 and second unit 300 in the first exemplary configuration are stacked one on another to form the body tube 110 like the one illustrated in FIG. 2. The first unit 200 includes the electromagnetic optical elements 40, the wires 42, a first partition wall 210, a second partition wall 220, a frame 230, supporting units 240, and a depressurization pump 420.

The first partition wall 210 and the second partition wall 220 are arranged separately from each other in the direction of extension of the body tube 110 in the body tube 110, and form non-vacuum spaces between at least parts of them. The non-vacuum spaces are depressurized spaces having pressures which are higher than the pressures in vacuum spaces through which electron beams pass, and are lower than atmospheric pressure. The first partition wall 210 and second partition wall 220 are fixed inside the frame 230.

The first partition wall 210 and second partition wall 220 have openings, each of which corresponds to one of a plurality of charged particle beams, and is for allowing the passage therethrough of the charged particle beam. FIG. 4 illustrates an example in which the first partition wall 210 has a plurality of openings 212, and the second partition wall 220 has a plurality of openings 222. Each of the plurality of openings 212 of the first partition wall 210 and each of the plurality of openings 222 of the second partition wall 220 may be formed corresponding to one of the paths $B_1$ to $B_n$ for the plurality of electron beams.

For example, one electron beam enters the first unit 200 from one opening 212, passes through the first unit 200, and exits from one corresponding opening 222. That is, the space from one opening 212 to one corresponding opening 222 forms a vacuum space through which an electron beam passes. The first partition wall 210 and second partition wall 220 may be formed of a non-magnetic metal. In addition, the first partition wall 210 and second partition wall 220 may be conductive ceramics or ceramics having conductive coatings formed on inner circumferential surfaces thereof.

The frame 230 is provided between the first partition wall 210 and the second partition wall 220. The frame 230 is formed in a cylindrical shape extending in the direction approximately parallel to the Z-axis direction, and forms part of the body tube 110. That is, a plurality of frames 230 each constitute part of the body tube 110. The frame 230 may contain iron or Permalloy. The frame 230 is desirably formed of a member that prevents an external weak magnetic field from exerting influence on the inner space of the body tube 110. The frame 230 has the recessed portion 204, the protruding portion 206, and an exhausting opening 410.

The recessed portion 204 may be formed on a surface of the frame 230 facing the sample 10. The protruding portion 206 may protrude from the frame 230 away from the sample 10. The recessed portion 204 and protruding portion 206 mate with corresponding second units 300. The exhausting opening 410 is connected to the depressurization pump 420.

The supporting units 240 are provided in the body tube 110, and support and position the plurality of electromagnetic optical elements 40 in place. The supporting units 240 are arranged between the first partition wall 210 and the second partition wall 220 in the direction of extension in the body tube 110. The supporting units 240 may be fixed to the frame 230. The supporting units 240 are desirably formed of a non-magnetic member.

By the supporting units 240 each positioning one of the plurality of electromagnetic optical elements 40 in place, the plurality of electromagnetic optical elements 40 are each provided corresponding to one of the plurality of charged particle beams in the body tube 110, and can control individual charged particle beams. In this case, the plurality of electromagnetic optical elements 40 are arranged between the first partition wall 210 and the second partition wall 220 in the direction of extension of the body tube 110. Here, the plurality of electromagnetic optical elements 40 and a surface of the first partition wall 210 on which the first partition wall 210 contacts the depressurized spaces are sealed together by vacuum seals. FIG. 4 illustrates an example in which the surface of the first partition wall 210 on which the first partition wall 210 contacts the depressurized spaces is a surface of the first partition wall 210 facing the sample 10.

In addition, the plurality of electromagnetic optical elements 40 and a surface of the second partition wall 220 at which the second partition wall 220 contacts the depressurized spaces are sealed together by vacuum seals. FIG. 4 illustrates an example in which the surface of the second partition wall 220 at which the second partition wall 220 contacts the depressurized spaces is a surface of the second partition wall 220 facing away from the sample 10. Note that the vacuum seals are made of an elastic material such as O-rings, for example.

In this manner, the plurality of electromagnetic optical elements 40 are provided in depressurized spaces between the first partition wall 210 and the second partition wall 220. In this case, the plurality of electromagnetic optical elements 40 may be sealed in by housing cases or the like. Note that if the plurality of electromagnetic optical elements 40 are sealed in by the housing cases, the housing cases may further have cooling units to cool the electromagnetic optical elements 40. The cooling units may have configurations through which a refrigerant such as a coolant is allowed to circulate, and instead of this may have a cooling device such as peltier elements. In addition, the housing cases may be sealed together with both the first partition wall 210 and the second partition wall 220. In addition, the wires 42 electrically connected to at least some of the plurality of electromagnetic optical elements 40 are also provided between the first partition wall 210 and the second partition wall 220.

In this manner, the inner space of the first unit 200 has non-vacuum areas that are airtight due to the first partition wall 210, second partition wall 220, and plurality of electromagnetic optical elements 40. FIG. 4 illustrates an example in which the first unit 200 has an integrated non-vacuum area formed therein. Note that the non-vacuum area may be divided into a plurality of areas by a partition wall or the like. Such a non-vacuum area is separated by using seals from a plurality of vacuum spaces including the plurality of openings 212 of the first partition wall 210 and the plurality of openings 222 of the second partition wall 220.

Note that if separated by using a seal from a non-vacuum space, each of the vacuum spaces may form a cylindrical shape extending in a direction approximately coinciding with the direction of extension of the body tube 110. In addition, the plurality of vacuum spaces formed in the first unit 200 are spatially connected with vacuum spaces of two second units 300 that are adjacent to the first unit 200 on the side closer to the sample 10 and on the side opposite to the sample 10. That is, some of the electromagnetic optical elements 40 may face vacuum spaces through which electron beams pass. In addition, some of the electromagnetic optical elements 40 may face non-vacuum spaces. That is, the electromagnetic optical elements 40 may function as walls between the vacuum spaces and the non-vacuum areas.

The depressurization pump 420 exhausts air through the exhausting opening 410 to thereby depressurize the non-vacuum spaces contacting the first partition wall 210 and the non-vacuum spaces contacting the second partition wall 220 to an air pressure between zero and atmospheric pressure. The depressurization pump 420 makes the non-vacuum spaces depressurized spaces with an approximately constant pressure. If the second unit 300 is depressurized and the vacuum areas are formed, the depressurization pump 420 may depressurize the non-vacuum spaces to an air pressure which allows reduction of warping generated to the first partition wall 210 and second partition wall 220. In addition, if the vacuum areas are formed in the second unit 300, the depressurization pump 420 may depressurize the non-vacuum spaces to an air pressure which prevents occurrence of degassing from the plurality of electromagnetic optical elements 40.

The second unit 300 in the first exemplary configuration includes an exhausting opening 310 and a frame 320. The frame 320 is formed in a cylindrical shape extending in the direction approximately parallel to the Z-axis direction, and forms part of the body tube 110. The frame 320 may contain iron or Permalloy. The frame 320 is desirably formed of a member that prevents an external weak magnetic field from exerting influence on the inner space of the body tube 110.

A surface of the frame 320 facing the sample 10 may have the recessed portion 304 formed thereon. The first unit 200 and the second unit 300 may be positioned in place by the recessed portion 304 mating with the protruding portion 206 of the first unit 200. In addition, the frame 320 may have the protruding portion 306 formed to protrude away from the sample 10. The first unit 200 and the second unit 300 may be positioned in place by the protruding portion 306 mating with the recessed portion 204 of the first unit 200.

With the use of the first units 200 and second units 300 in the first exemplary configuration mentioned above, the exposure device 100 according to the present embodiment can be formed by stacking the first units 200 and second units 300 one on another while positioning the individual units in place, similar to the case where the first units 200 and second units 300 in the exemplary comparative configuration are used. That is, the body tube 110 can be formed precisely.

In addition, since the exposure device 100 also depressurizes the non-vacuum spaces of the first units 200 to make them depressurized spaces even if the second units 300 are vacuum-exhausted through the exhausting openings 310, deformation of the first partition walls 210 and the second partition walls 220 can be reduced. Accordingly, the exposure device 100 can prevent vacuum leakages due to deformation of partition walls or the like. In addition, since the electromagnetic optical elements 40 are fixed to the supporting units 240, they can be positioned in place stably without being moved in the body tube 110 almost at all. Accordingly, the exposure device 100 can keep the state where the optical systems for a plurality of electron beams are positioned in place as in the state where they are positioned in place at atmospheric pressure, and can prevent the precision of drawing of patterns on the sample 10 from lowering.

As explained above, since the first units 200 in the first exemplary configuration mentioned above have depressurized spaces having a pressure higher than that of the second units 300 and lower than atmospheric pressure, deformation of the first partition wall 210 and the second partition wall 220 is reduced. In addition to this, the first unit 200 may have a plurality of depressurized spaces that are kept at different pressures. Such first units 200 and second units 300 are explained next.

Figure 5:
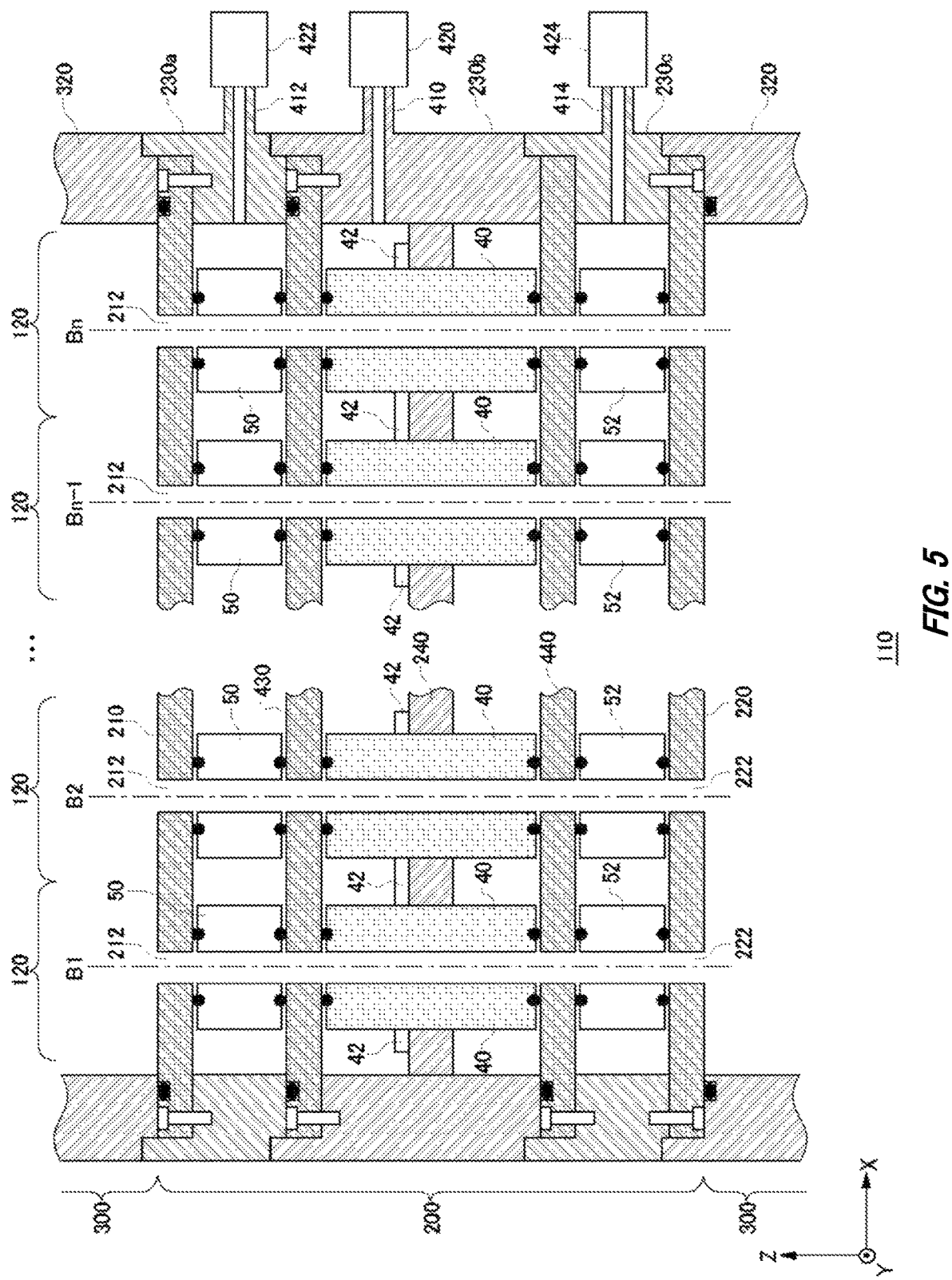
FIG. 5 illustrates a second exemplary configuration of the first unit 200 and second units 300 according to the present embodiment.

FIG. 5 illustrates a second exemplary configuration of the first unit 200 and second units 300 according to the present embodiment. Elements of the first unit 200 and second units 300 in the second exemplary configuration that operate in approximately the same manners as operations of the first unit 200 and second units 300 in the first exemplary configuration illustrated in FIG. 4 are given the same symbols, and explanations thereof are omitted. Similar to FIG. 4, FIG. 5 illustrates an exemplary cross-sectional view of the body tube 110 taken along a plane approximately parallel to the Z-X-plane.

Similar to the first unit 200 and second units 300 in the first exemplary configuration, the first unit 200 and the second unit 300 in the second exemplary configuration are stacked one on another to form the body tube 110 like the one illustrated in FIG. 2. The first unit 200 in the second exemplary configuration has a plurality of non-vacuum spaces in the direction of extension of the body tube 110. The first unit 200 further includes dummy elements 50, dummy elements 52, a third partition wall 430, a fourth partition wall 440, a depressurization pump 422, and a depressurization pump 424.

The third partition wall 430 is provided between the first partition wall 210 and the second partition wall 220. In addition, the fourth partition wall 440 is provided between the third partition wall 430 and the second partition wall 220. That is, the four partition walls, which are the first partition wall 210 to the fourth partition wall 440, are arranged separately from each other in the direction of extension of the body tube 110 in the body tube 110, and form non-vacuum spaces between at least parts of them. The four partition walls are fixed inside the frame 230.

Similar to the first partition wall 210 and second partition wall 220, the third partition wall 430 and fourth partition wall 440 have a plurality of openings, each of which corresponds to one of a plurality of charged particle beams, and is for allowing the passage therethrough of the charged particle beam. Similar to the first partition wall 210 and second partition wall 220, the third partition wall 430 and fourth partition wall 440 may have a plurality of openings each formed corresponding to the paths $B_1$ to $B_n$ for a plurality of electron beams. That is, the space from one opening 212 to one corresponding opening 222 forms a vacuum space through which an electron beam passes. The third partition wall 430 and fourth partition wall 440 are desirably formed of a material which is approximately the same as that of the first partition wall 210 and second partition wall 220.

The first unit 200 in the second exemplary configuration may have a plurality of frames that are stacked one on another to form part of the body tube 110 corresponding to the frame 230 in the first exemplary configuration. FIG. 5 illustrates an example in which three frames, a frame 230a, a frame 230b, and a frame 230c, are stacked one on another. Note that the frame 230a may be provided between the first partition wall 210 and the third partition wall 430, the frame 230b may be provided between the third partition wall 430 and the fourth partition wall 440, and the frame 230c may be provided between the fourth partition wall 440 and the first partition wall 210. The plurality of frames are desirably formed of approximately the same material.

Each frame may be provided with an exhausting opening. FIG. 5 illustrates an example in which the frame 230a, frame 230b, and frame 230c are provided with an exhausting opening 412, the exhausting opening 410, and an exhausting opening 414, respectively.

Similar to the first unit 200 in the first exemplary configuration, the supporting units 240 each position one of the plurality of electromagnetic optical elements 40 in place. FIG. 5 illustrates an example in which the supporting units 240, plurality of electromagnetic optical elements 40, and wires 42 are arranged between the third partition wall 430 and the fourth partition wall 440. In this case, the plurality of electromagnetic optical elements 40 and a surface of the third partition wall 430 facing the sample 10 are sealed together by vacuum seals. In addition, the plurality of electromagnetic optical elements 40 and a surface of the fourth partition wall 440 facing away from the sample 10 are sealed together by vacuum seals.

That is, the third partition wall 430, fourth partition wall 440, plurality of electromagnetic optical elements 40, and frame 230b form non-vacuum spaces. In the present embodiment, the non-vacuum spaces between the third partition wall 430 and the fourth partition wall 440 are called first non-vacuum spaces. The first non-vacuum spaces may be depressurized by the depressurization pump 420 connected to the exhausting opening 410. The first non-vacuum spaces are desirably kept at a degree of vacuum which does not generate degassing from the plurality of electromagnetic optical elements 40.

Similarly, at least part of the space between the first partition wall 210 and the third partition wall 430 forms non-vacuum spaces. The space between the first partition wall 210 and the third partition wall 430 is provided with the plurality of dummy elements 50. In this case, the plurality of dummy elements 50 and a surface of the first partition wall 210 facing the sample 10 are sealed together by vacuum seals. In addition, the plurality of dummy elements 50 and a surface of the third partition wall 430 facing away from the sample 10 are sealed together by vacuum seals.

In this manner, the first partition wall 210, third partition wall 430, plurality of dummy elements 50, and frame 230a form non-vacuum spaces. In the present embodiment, the non-vacuum spaces between the first partition wall 210 and the third partition wall 430 are called second non-vacuum spaces. The second non-vacuum spaces may be depressurized by the depressurization pump 422 connected to the exhausting opening 412. The second non-vacuum spaces are desirably kept at a degree of vacuum which allows reduction of warping generated to the first partition wall 210 if the second unit 300 is depressurized, and vacuum areas are formed.

Similarly, at least part of the space between the fourth partition wall 440 and the second partition wall 220 forms non-vacuum spaces. The space between the fourth partition wall 440 and the second partition wall 220 are provided with the plurality of dummy elements 52. In this case, the plurality of dummy elements 52 and a surface of the fourth partition wall 440 facing the sample 10 are sealed together by vacuum seals. In addition, the plurality of dummy elements 52 and a surface of the second partition wall 220 facing away from the sample 10 are sealed together by vacuum seals.

In this manner, the fourth partition wall 440, second partition wall 220, plurality of dummy elements 52 and the frame 230c form non-vacuum spaces. In the present embodiment, the non-vacuum spaces between the fourth partition wall 440 and the second partition wall 220 are called third non-vacuum spaces. The third non-vacuum spaces may be depressurized by the depressurization pump 424 connected to the exhausting opening 414. The third non-vacuum spaces are desirably kept at a degree of vacuum which allows reduction of warping generated to the second partition wall 220 if the second unit 300 is depressurized, and vacuum areas are formed. In addition, a single depressurization pump may serve as both the depressurization pump 424 and the depressurization pump 422. That is, the second non-vacuum space and third non-vacuum space may be kept at approximately the same pressures.

In the first unit 200 in the second exemplary configuration mentioned above, a plurality of partition walls form a plurality of non-vacuum spaces. For example, the first non-vacuum spaces in which the plurality of electromagnetic optical elements 40 are provided are formed between the second non-vacuum spaces and the third non-vacuum spaces. Then, at least a partial space between the third partition wall 430 and the fourth partition wall 440 (i.e., the first non-vacuum spaces) is kept at an air pressure higher than the air pressure of the space between the first partition wall 210 and the third partition wall 430 (i.e., the second non-vacuum spaces), and the space between the second partition wall 220 and the fourth partition wall 440 (i.e., the third non-vacuum space).

In this manner, since the space between the vacuum spaces of the second units 300 and the first non-vacuum spaces of the first unit 200 can be caused to have the degrees of vacuum that are different stepwise, the first non-vacuum spaces can be kept at a pressure closer to atmospheric pressure. Accordingly, while the plurality of electromagnetic optical elements 40 provided in the first non-vacuum spaces are fixed, and are operated at a pressure close to atmospheric pressure, it is possible to reduce deformation of the first partition wall 210 and the second partition wall 220.

Note that although the first non-vacuum spaces are desirably kept at a pressure closer to atmospheric pressure as compared with the second non-vacuum spaces and third non-vacuum spaces, instead of this, the first non-vacuum spaces may be kept at atmospheric pressure. In this case, the exhausting opening 410 and depressurization pump 420 may not be present. In addition, in the present embodiment explained, the first unit 200 has the plurality of dummy elements 50 and plurality of dummy elements 52, at least some of them may be electromagnetic optical elements 40.

In the example explained above, the first unit 200 and second units 300 according to the present embodiment mentioned above reduce differences between the degrees of vacuum in the vacuum spaces and the non-vacuum spaces to thereby reduce deformation of partition walls. Instead of this or in addition to this, deformation of partition walls may be reduced physically. Such a first unit 200 and second units 300 are explained next.

Figure 6:
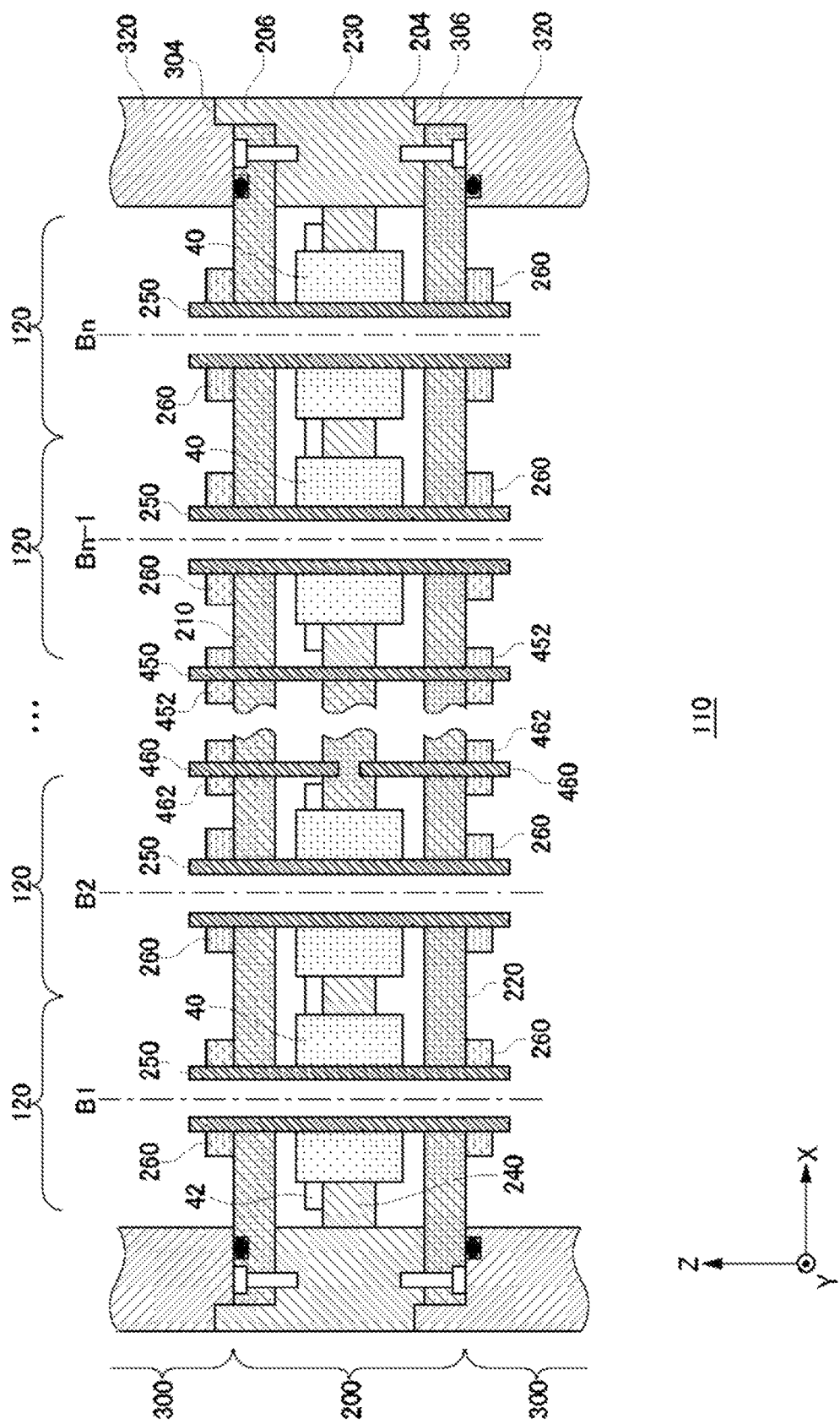
FIG. 6 illustrates a third exemplary configuration of the first unit 200 and second units 300 according to the present embodiment.

FIG. 6 illustrates a third exemplary configuration of the first unit 200 and second units 300 according to the present embodiment. Elements of the first unit 200 and second units 300 in the third exemplary configuration that operate in approximately the same manners as operations of the first unit 200 and second units 300 in the first exemplary configuration illustrated in FIG. 4 are given the same symbols, and explanations thereof are omitted. Similar to FIG. 4, FIG. 6 illustrates an exemplary cross-sectional view of the body tube 110 taken along a plane approximately parallel to the Z-X-plane. In the first unit 200 in the third exemplary configuration, the first partition wall 210 and the second partition wall 220 are fixed to each other at a plurality of locations other than edge portions. The first unit 200 further includes cylindrical members 250 and nuts 260.

The plurality of cylindrical members 250 are provided corresponding to a plurality of charged particle beams, and penetrates the first partition wall 210, supporting units 240, and second partition wall 220. That is, each of the first partition wall 210, second partition wall 220, and supporting units 240 has a plurality of through-holes which the cylindrical members 250 penetrate. Each of the cylindrical members 250 has a hollow inner space which serves as a vacuum space, and an electron beam passes therethrough. Each of the plurality of cylindrical members 250 is fixed to a supporting unit 240.

Each of the plurality of cylindrical members 250, and the first partition wall 210 and second partition wall 220 may be sealed together by a vacuum seal. In addition, each of the plurality of cylindrical members 250 and a supporting unit 240 may be sealed together by a vacuum seal. The inner space of the first unit 200 has one or more non-vacuum spaces formed by the first partition wall 210, second partition wall 220, frame 230, and cylindrical members 250.

The first partition wall 210 and second partition wall 220 in the third exemplary configuration are pressed by both sides of each of the plurality of cylindrical members 250. For example, each of the plurality of cylindrical members 250 is threaded at at least one end portion thereof, and a nut 260 is screwed onto the at least one end portion. Thereby, at least one of the first partition wall 210 and the second partition wall 220 is pressed by the nut 260. FIG. 6 illustrates an example in which each of the plurality of cylindrical members 250 is threaded at both ends thereof, and nuts 260 are screwed onto the both ends.

In this manner, while the vacuum spaces and the non-vacuum spaces are separated by the cylindrical members 250 in the first unit 200 in the third exemplary configuration, the first partition wall 210 and/or the second partition wall 220 are pressed by nuts 260 at one end or both ends of each of the cylindrical members 250. Thereby, deformation of the first partition wall 210 and/or the second partition wall 220 can be reduced while the space for fixing the partition walls is kept small. In addition, the cylindrical members 250 may be at least partially fixed by flanges and fixation screws.

Instead of this or in addition to this, the first unit 200 may use fixation members that are different from the cylindrical members 250 and nuts 260 to reduce deformation of the first partition wall 210 and/or second partition wall 220. For example, the first unit 200 further includes one or more fixation members 450 that penetrate the first partition wall 210 and second partition wall 220 at one or more locations other than their edge portions, and press them from both sides.

The fixation members 450 may be threaded, and screwed into the first partition wall 210 and second partition wall 220. Instead of this, the fixation members 450 may be threaded at at least both ends thereof, penetrate the first partition wall 210, second partition wall 220, and supporting units 240, and then receive the nuts 452 that are screwed onto the both ends. FIG. 6 illustrates an example in which the fixation members 450 are threaded at both ends thereof, and the nuts 452 are screwed onto the both ends.

Instead of this or in addition to this, the first unit 200 may use fixation members realized by bolts and nuts. In this case, each of the plurality of fixation members may have: a bolt that penetrates the first partition wall 210 and second partition wall 220; and a nut screwed onto the bolt. In this case also, similar effects to those attained by a combination of a fixation member 450 and a nut 452 can be attained.

Instead of this or in addition to this, the first unit 200 may use fixation members fixed to the supporting units 240 to reduce deformation of the first partition wall 210 and/or second partition wall 220. For example, the first unit 200 further includes one or more fixation members 460 that penetrate the first partition wall 210 or second partition wall 220 at one or more locations other than their edge portions, and are fixed to the supporting units 240.

A fixation member 460 is threaded at both ends thereof, and one end may penetrate the first partition wall 210 or the second partition wall 220, and then screwed into a supporting unit 240. In addition, the other end of the fixation member 460 may receive a nut 462 screwed onto the end. Instead of this, the fixation member 460 may be a bolt that penetrates the first partition wall 210 or the second partition wall 220, and then screwed into a supporting unit 240.

In this manner, the first partition wall 210 and the second partition wall 220 are screwed onto members provided in the space between the first partition wall 210 and the second partition wall 220 at one or more locations other than edge portions. For example, if the third partition wall is provided between the first partition wall 210 and the second partition wall 220, the fixation members 460 may be fixed to the third partition wall. FIG. 6 illustrates an example in which the fixation members 460 and nuts 462 are provided on the side closer to the first partition wall 210 and on the side closer to the second partition wall 220.

In this manner, although in the example explained above, the first unit 200 in the third exemplary configuration uses fixation members to reduce deformation of the first partition wall 210 and second partition wall 220 physically, the fixation members are not limited to those explained above as examples. A fixation member may have a protruding portion, a recessed portion, a hole portion, and/or a groove portion, penetrate the first partition wall 210 and/or the second partition wall 220 to be then fixed by mating with the first partition wall 210 and/or the second partition wall 220, and thereby reduce deformation of the first partition wall 210 and second partition wall 220.

Figure 7:
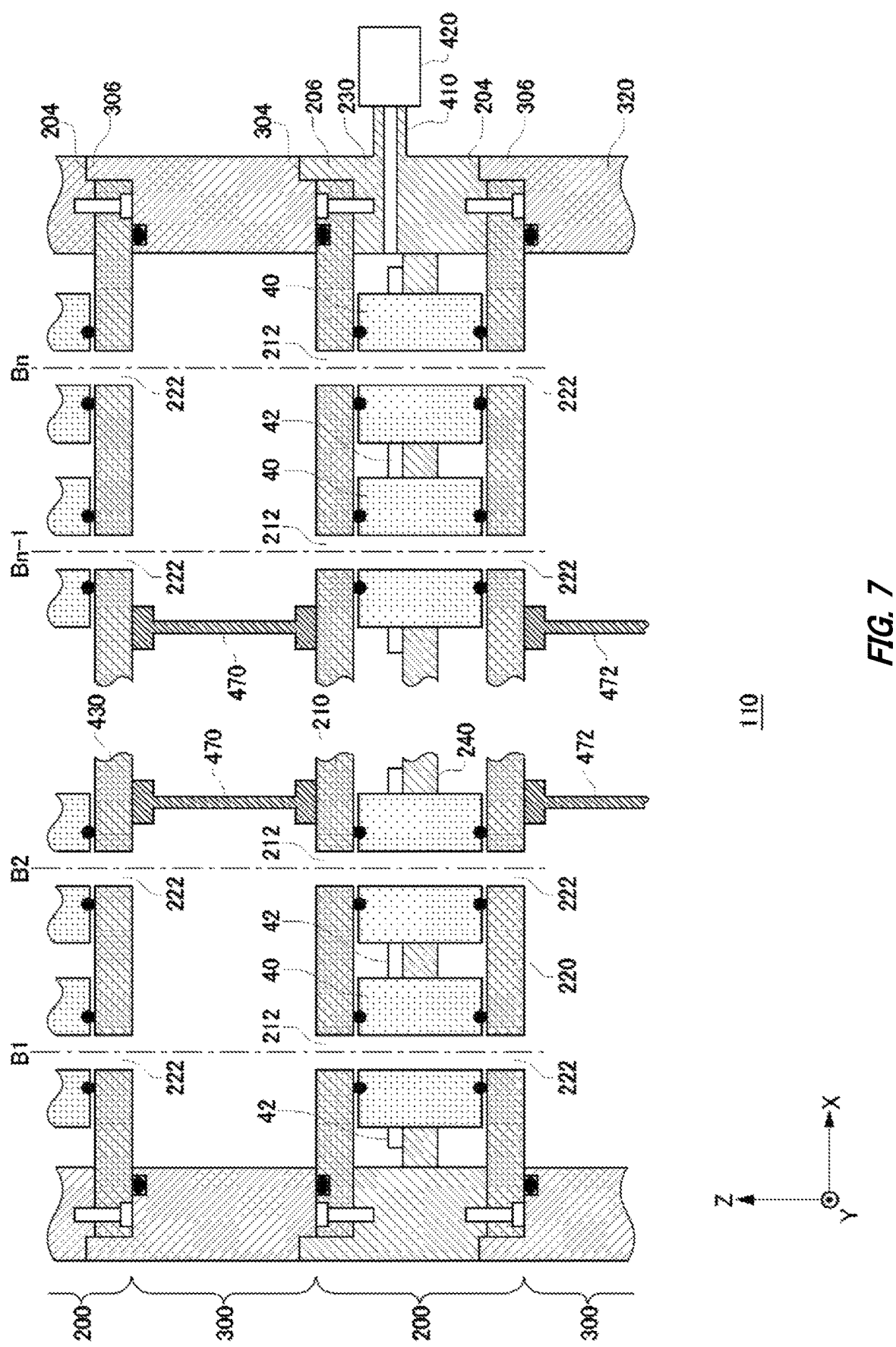
FIG. 7 illustrates a fourth exemplary configuration of the first units 200 and second units 300 according to the present embodiment.

FIG. 7 illustrates a fourth exemplary configuration of the first units 200 and second units 300 according to the present embodiment. Elements of the first units 200 and second units 300 in the fourth exemplary configuration that operate in approximately the same manners as operations of the first unit 200 and second units 300 in the first exemplary configuration illustrated in FIG. 4 are given the same symbols, and explanations thereof are omitted. Similar to FIG. 4, FIG. 7 illustrates an exemplary cross-sectional view of the body tube 110 taken along a plane approximately parallel to the Z-X-plane.

Similar to the first unit 200 in the third exemplary configuration, in the first units 200 in the fourth exemplary configuration, the first partition wall 210 and the second partition wall 220 are fixed to each other at a plurality of locations other than edge portions. In addition, in the first units 200 in the fourth exemplary configuration, deformation of the first partition wall 210 and second partition wall 220 is reduced by reinforcing members provided in the second units 300. The second units 300 in the fourth exemplary configuration further include first reinforcing members 470 and second reinforcing members 472.

Here, the body tube 110 may further include therein a third partition wall that is arranged separately from the first partition wall 210 in the direction of extension of the body tube 110, and forms a vacuum space between the third partition wall and the first partition wall 210. Note that the third partition wall may be provided in a second unit 300. Instead of this, the third partition wall may be a second partition wall 220 of a first unit 200 stacked further on a second unit 300. In FIG. 7, the second partition wall of the first unit 200 equivalent to the third partition wall is represented as a third partition wall 430.

The one or more first reinforcing members 470 are provided between the first partition wall 210 and the third partition wall, and extend in the direction of extension of the body tube 110. The first reinforcing members 470 may function as props. That is, the first partition wall 210 is pressed toward the second partition wall 220 by the first reinforcing members 470.

Similarly, the body tube 110 may further include therein a fourth partition wall that is arranged separately from the second partition wall 220 in the direction of extension of the body tube 110, and forms a vacuum space between itself and the second partition wall 220. Note that the fourth partition wall may be provided in a second unit 300. Instead of this, the fourth partition wall may be a first partition wall 210 of another first unit 200 that is stacked on the side closer to the sample 10 than the first unit 200.

The one or more second reinforcing members 472 are provided between the second partition wall 220 and the fourth partition wall, and extend in the direction of extension of the body tube 110. The second reinforcing members 472 may function as props. That is, the second partition wall 220 is pressed toward the first partition wall 210 by the second reinforcing members 472.

The first units 200 and second units 300 in the fourth exemplary configuration mentioned above can reduce deformation of the first partition wall 210 and second partition wall 220 by using the reinforcing members provided on the side closer to the vacuum spaces. Note that the reinforcing members may not have pressing force almost at all if the pressure in the body tube 110 is atmospheric pressure, and may function as supports if the body tube 110 is depressurized, and partition walls are deformed. Instead of this, the reinforcing members may have elastic force or the like, and press the first partition wall 210 and second partition wall 220 also if the pressure in the body tube 110 is atmospheric pressure.

Note that in the example illustrated in FIG. 7, the first unit 200 can exhaust air inside non-vacuum spaces to produce depressurized spaces as explained with reference to FIG. 4. In this manner, the first unit 200 and second unit 300 may include a plurality of configurations to reduce deformation of the first partition wall 210 and second partition wall 220.

Figure 8:
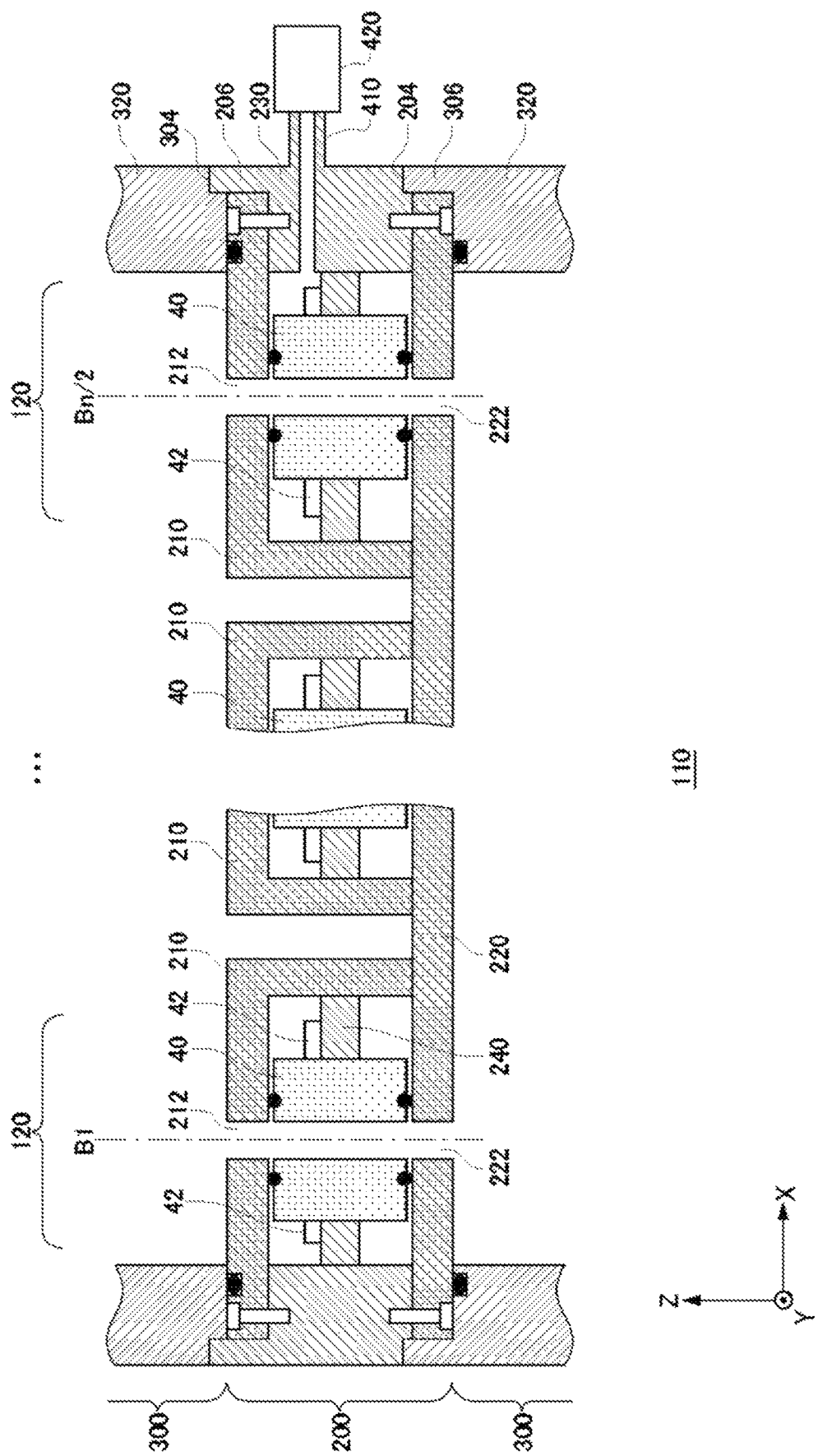
FIG. 8 illustrates a fifth exemplary configuration of the first unit 200 and second units 300 according to the present embodiment.

FIG. 8 illustrates a fifth exemplary configuration of the first unit 200 and second units 300 according to the present embodiment. Elements of the first unit 200 and second units 300 in the fifth exemplary configuration that operate in approximately the same manners as operations of the first unit 200 and second units 300 in the first exemplary configuration illustrated in FIG. 4 are given the same symbols, and explanations thereof are omitted. Similar to FIG. 4, FIG. 8 illustrates an exemplary cross-sectional view of the body tube 110 taken along a plane approximately parallel to the Z-X-plane.

The first unit 200 in the fifth exemplary configuration reduces deformation of partition walls by reducing the volume of non-vacuum spaces. For example, the first partition wall 210 and second partition wall 220 form non-vacuum spaces only at parts of a cross-section of the body tube 110 approximately perpendicular to the direction of extension of the body tube 110, and form vacuum spaces in remaining portions. In this case, the first partition walls 210 and second partition wall 220 may form non-vacuum spaces, the number of which corresponds to the number of electron beams. FIG. 8 illustrates an example in which the first partition walls 210 and second partition wall 220 form a non-vacuum space for each of a plurality of electron beams arrayed in the Y-direction.

In this manner, corresponding to each of a plurality of non-vacuum spaces, the first unit 200 may be provided with each of a plurality of the first partition walls 210 facing the second partition wall 220. For example, a first partition wall 210 is provided to cover and seal each of the plurality of electromagnetic optical elements 40 column by column in the Y-direction. In this case, at portions of the second partition wall 220 where the plurality of non-vacuum spaces are not formed, the second partition wall 220 may be exposed toward both the plurality of charged particle beam sources 20 and a side opposite to the plurality of charged particle beam sources 20.

Note that each of the plurality of electromagnetic optical elements 40 is arranged in the one or more non-vacuum spaces formed by the first partition walls 210 and the second partition wall 220. In addition, one non-vacuum space may contact the inner wall of the body tube 110. Then, each of the one or more non-vacuum spaces may be provided with a wire 42 therein that contacts the inner wall of the body tube 110, and is connected to at least some of the plurality of electromagnetic optical elements 40. In this manner, each of the plurality of electromagnetic optical elements 40 arranged in one non-vacuum space may be able to be supplied with a driving current or the like by a wire 42 connected from the inner wall into the inner space.

In this manner, by reducing the volume of non-vacuum spaces, and also dividing the non-vacuum spaces, deformation of partition walls can be reduced. Note that, in this case, the arrangement of electron beams may be altered to divide the non-vacuum spaces. FIG. 8 illustrates an example in which the arrangement interval of electron beams in the X-direction is approximately doubled as compared with the example illustrated in FIG. 4 to divide the non-vacuum spaces. In addition, although it is explained with reference to FIG. 8 that the plurality of first partition walls 210 are used to divide the non-vacuum spaces, this is not the sole example. The first partition walls 210 and/or second partition wall 220 may have a plurality of wall surfaces that divide the non-vacuum spaces. A first unit 200 including such first partition walls 210 is explained next.

Figure 9:
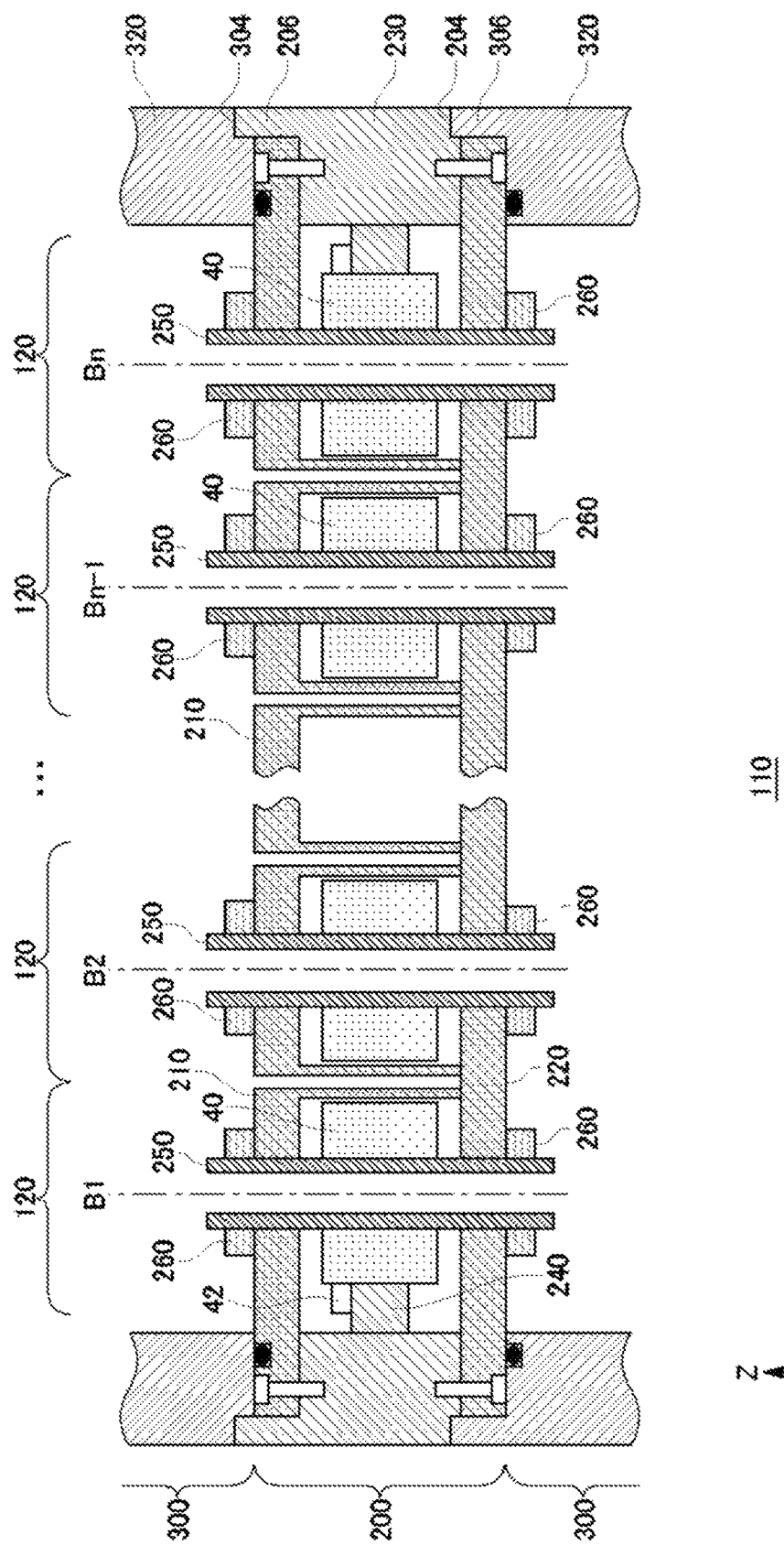
FIG. 9 illustrates a sixth exemplary configuration of the first unit 200 and second units 300 according to the present embodiment.

FIG. 9 illustrates a sixth exemplary configuration of the first unit 200 and second units 300 according to the present embodiment. Elements of the first unit 200 and second units 300 in the sixth exemplary configuration that operate in approximately the same manners as operations of the first unit 200 and second units 300 in the third exemplary configuration illustrated in FIG. 6 are given the same symbols, and explanations thereof are omitted. Similar to FIG. 6, FIG. 9 illustrates an exemplary cross-sectional view of the body tube 110 taken along a plane approximately parallel to the Z-X-plane.

The first unit 200 in the sixth exemplary configuration reduces deformation of partition walls by reducing the volume of non-vacuum spaces. The first unit 200 in the sixth exemplary configuration is provided with a plurality of spaces between the first partition walls 210 and the second partition wall 220. For example, FIG. 9 illustrates an example in which a first partition wall 210 has a plurality of wall surfaces that extend in a direction approximately parallel to the direction of extension of the body tube 110, and the plurality of wall surfaces form a plurality of spaces. In addition, FIG. 9 illustrates an example in which cylindrical members 250 and nuts 260 are used, similar to the first unit 200 in the third exemplary configuration. Note that the cylindrical members 250 may be at least partially fixed by flanges and fixation screws.

That is, the first unit 200 in the sixth exemplary configuration is divided into: vacuum spaces inside the cylindrical members 250; non-vacuum spaces surrounded by the first partition walls 210, second partition wall 220, and cylindrical members 250; and remaining spaces. In this manner, some of the plurality of spaces may be non-vacuum spaces, and the non-vacuum spaces may be divided into a plurality of spaces by a plurality of wall surfaces provided to the first partition walls 210 and/or the second partition wall 220. The non-vacuum spaces may be divided in the row-direction, the column direction, in a grid, or concentrically on a plane approximately perpendicular to the direction of extension of the body tube 110 (i.e., a plane approximately parallel to the X-Y plane).

In addition, the remaining spaces of the first unit 200 may be spaces that communicate with vacuum spaces on at least one of the first partition wall 210 side and the second partition wall 220 side. FIG. 9 illustrates an example in which the remaining spaces serve as spaces to communicate with the vacuum spaces of the second unit 300 on the first partition wall 210 side. In this manner, by reducing the volume of non-vacuum spaces, and also dividing the non-vacuum spaces, deformation of partition walls can be reduced. In addition, by using the cylindrical members 250 and nuts 260, deformation of partition walls can be reduced further.

In the explanation above, air inside the inner spaces of the second units 300 according to the present embodiment mentioned above is exhausted to produce vacuum spaces. Here, at least some of the second units 300 may have divided vacuum spaces. For example, a second unit 300 may have a plurality of wall surfaces that extend in a direction approximately parallel to the direction of extension of the body tube 110, and deformation of the first partition walls 210 and second partition wall 220 of the first unit 200 may be reduced. In addition, a second unit 300 may have non-vacuum spaces formed therein if vacuum spaces are divided. One example of second units 300 having such divided vacuum spaces is explained next.

Figure 10:
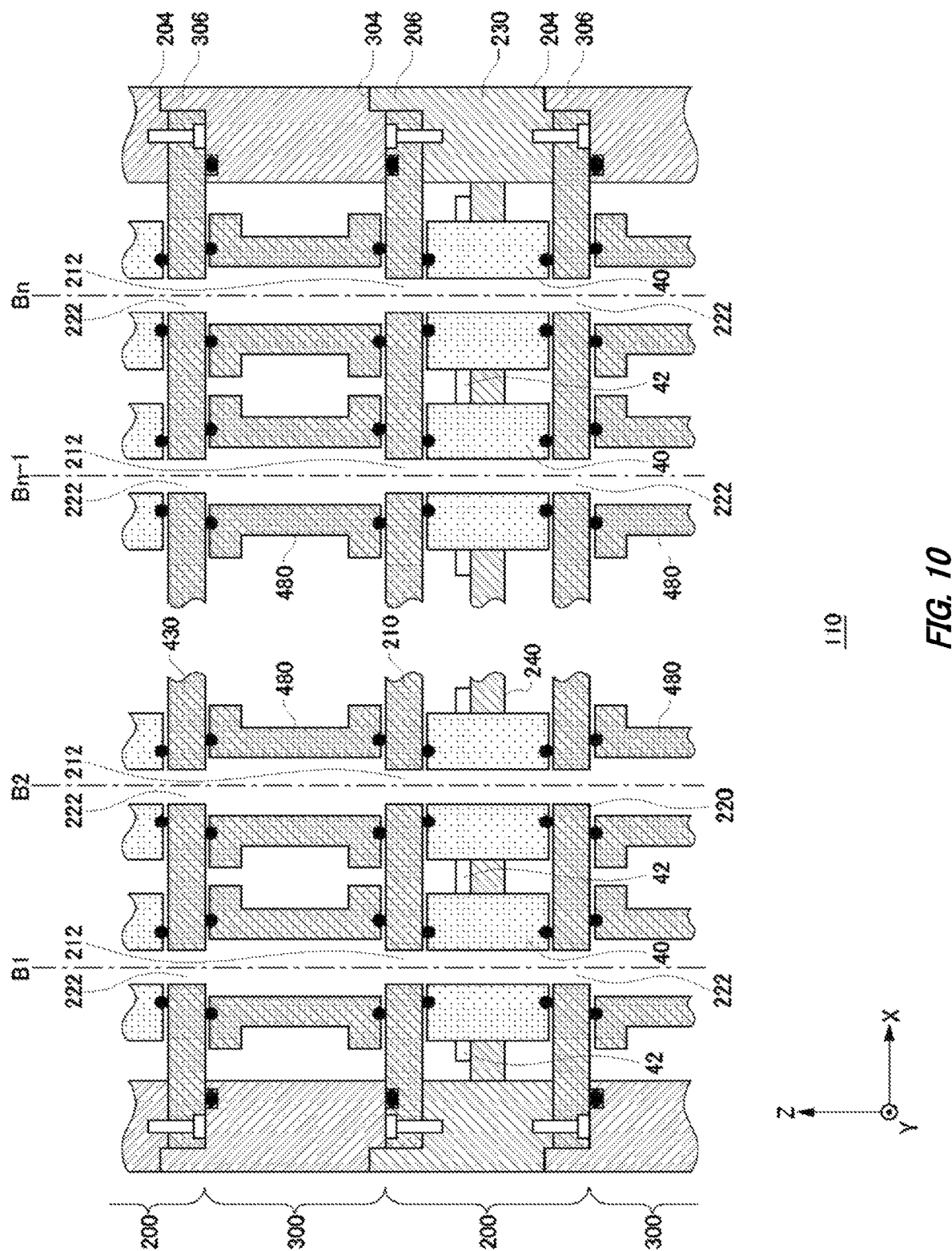
FIG. 10 illustrates a seventh exemplary configuration of the first units 200 and second units 300 according to the present embodiment.

FIG. 10 illustrates a seventh exemplary configuration of the first units 200 and second units 300 according to the present embodiment. Elements of the first unit 200 and second units 300 in the seventh exemplary configuration that operate in approximately the same manners as operations of the first unit 200 and second units 300 in the first exemplary configuration illustrated in FIG. 4 are given the same symbols, and explanations thereof are omitted. Similar to FIG. 4, FIG. 10 illustrates an exemplary cross-sectional view of the body tube 110 taken along a plane approximately parallel to the Z-X-plane.

The first units 200 and second units 300 in the seventh exemplary configuration have vacuum spaces that are divided by hollow members, and thereby reduce deformation of partition walls. The first units 200 in the seventh exemplary configuration have first partition walls 210 and second partition walls 220 that are arranged in order separately from each other in the direction of extension of the body tube 110 in the body tube 110. In addition, the body tube 110 has third partition walls that are arranged separately from the first partition walls 210 and second partition walls 220 in the direction of extension in the body tube 110. Note that the third partition walls may be second partition walls 220 of a first unit 200 stacked further on a second unit 300. In FIG. 10, the second partition walls of the first unit 200 equivalent to the third partition walls are represented as third partition walls 430.

The second units 300 in the seventh exemplary configuration further include hollow members 480. The hollow members 480 surround partial spaces which are between the first partition walls 210 and the third partition walls 430 in the body tube 110, and through which a plurality of charged particle beams pass. The hollow members 480 may be formed in a cylindrical shape that extends in a direction approximately parallel to the direction of extension of the body tube 110. Here, an end portion of a hollow member 480 close to the sample 10 is treated as a first end, and an end portion thereof closer to a charged particle beam source 20 is treated as a second end. The hollow member 480 has a first end that contacts the first partition wall 210, and the first partition wall 210 and the first end are sealed together by a vacuum seal. In addition, the hollow member 480 has a second end that contacts the third partition wall 430, and the third partition wall 430 and the second end are sealed together by a vacuum seal.

The second units 300 in the seventh exemplary configuration mentioned above can form a plurality of vacuum spaces through which electron beams are allowed to pass by the depressurization pump 420 exhausting air inside the hollow members 480 to produce the vacuum state. Note that the plurality of hollow members 480 may have inner spaces that are connected to the exhausting openings 410 such that air inside the inner spaces is exhausted through the exhausting openings 410. Thereby, the second units 300 have divided, and reduced vacuum spaces so that deformation of the first partition walls 210 and second partition walls 220 can be reduced.

Note that the areas outside the hollow members 480 in the second units 300 where electron beams do not pass may be non-vacuum spaces. In this case, the non-vacuum spaces of the second unit 300 may be spaces to communicate with the non-vacuum spaces of the first units 200. In addition, in this case, the non-vacuum spaces of the first units 200 and second units 300 may be kept at an air pressure approximately the same as atmospheric pressure.

In addition, the explanation above illustrated an example in which the hollow members 480 are provided in the second units 300 stacked on the first unit 200 on the side closer to the charged particle beam sources 20. Instead of this or in addition to this, the hollow members 480 may be provided to a second unit 300 positioned adjacent to the first unit 200 on the side closer to the sample 10. FIG. 10 illustrates an example in which the hollow members 480 are provided in both two second units 300 that are adjacent to the first unit 200 on the side closer to the sample 10 and on the side closer to the charged particle beam sources 20.

Although the explanation above illustrated an example of the first units 200 and second units 300 in the seventh exemplary configuration mentioned above in which the hollow members 480 are provided in the second units 300, and the spaces through which electron beams pass are vacuum spaces, this is not the sole example. Instead of this, the first units 200 and second units 300 may include hollow members that penetrate the first units 200 and second units 300. An example of such first units 200 and second units 300 is illustrated next.

Figure 11:
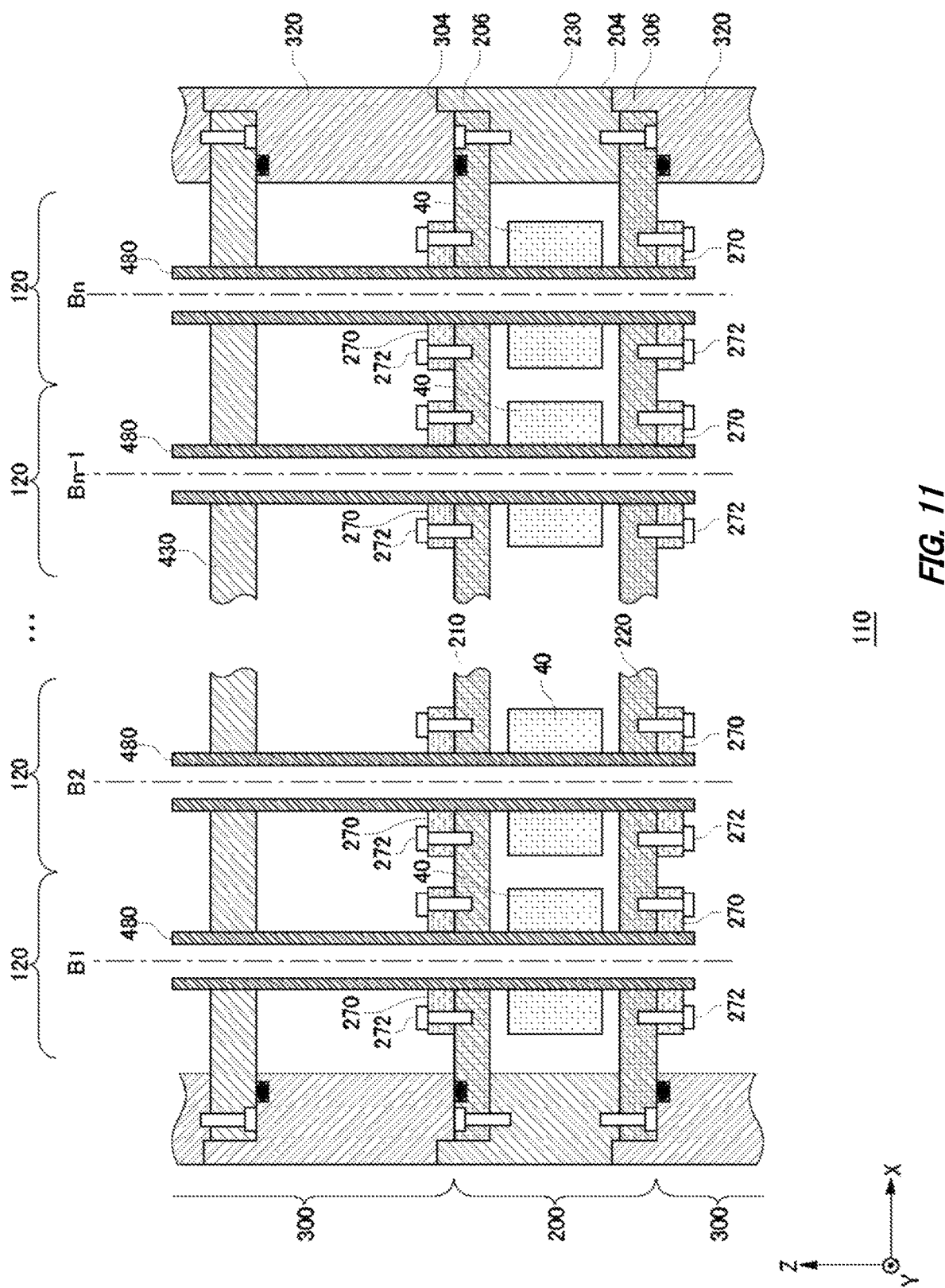
FIG. 11 illustrates an eighth exemplary configuration of the first unit 200 and second units 300 according to the present embodiment.

FIG. 11 illustrates an eighth exemplary configuration of the first unit 200 and second units 300 according to the present embodiment. Elements of the first unit 200 and second units 300 in the eighth exemplary configuration that operate in approximately the same manners as operations of the first unit 200 and second units 300 in the third exemplary configuration illustrated in FIG. 6 are given the same symbols, and explanations thereof are omitted. Similar to FIG. 6, FIG. 11 illustrates an exemplary cross-sectional view of the body tube 110 taken along a plane approximately parallel to the Z-X-plane.

Similar to the first units 200 and second units 300 in the seventh exemplary configuration, the first unit 200 and second units 300 in the eighth exemplary configuration have vacuum spaces that are divided by hollow members 480, and reduce deformation of partition walls. The first unit 200 and second unit 300 in the eighth exemplary configuration have a plurality of hollow members 480 that each surround a space through which each of a plurality of charged particle beams passes. Each of the hollow members penetrates the first partition wall 210, the second partition wall 220, and the third partition wall 430. Note that at least some of the hollow members 480 may be fixed by flanges 270 and fixation screws 272.

Note that the third partition wall 430 may be a second partition wall 220 of a first unit 200 stacked further on a second unit 300. In FIG. 10, the second partition wall of the first unit 200 equivalent to the third partition wall is represented as a third partition wall 430.

Note that although the explanation above illustrated an example of the first unit 200 and second units 300 in the eighth exemplary configuration in which the hollow members 480 penetrate the first partition wall 210, second partition wall 220, and third partition wall 430, this is not the sole example. The first unit 200 and second units 300 may have hollow members 480 that penetrate the first partition wall 210, second partition wall 220, and fourth partition wall 440. Note that the fourth partition wall may be a first partition wall 210 of another first unit 200 that is stacked on the side closer to the sample 10 than the first unit 200.

In addition, although members that penetrate the first unit 200 and second units 300 are represented as the hollow members 480, the hollow members 480 may be member that are formed by extending, lengthwise, the cylindrical members 250 explained with reference to FIG. 6. In addition, the inner diameters of the hollow members 480 may be different location by location. For example, the inner diameters of the hollow members 480 in the second units 300 may be formed larger than the inner diameters of the hollow members 480 in the first units 200.

Although the explanation of the present embodiment above illustrated an example in which non-vacuum spaces are formed between the first partition wall 210 and second partition wall 220 of the first unit 200, this is not the sole example. Non-vacuum spaces may not be formed between the first partition wall 210 and the second partition wall 220. An example of such first units 200 and second units 300 is illustrated next.

Figure 12:
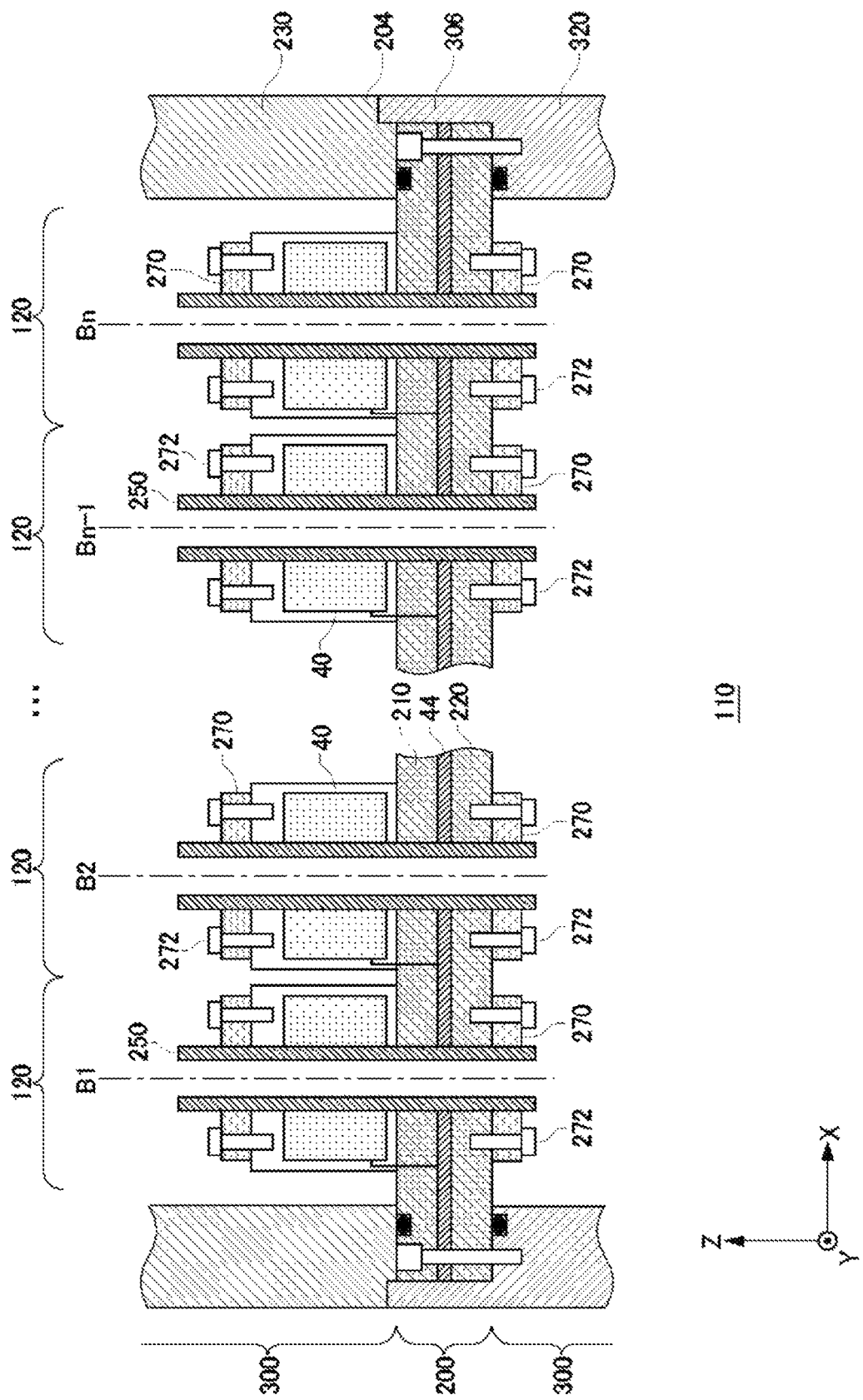
FIG. 12 illustrates a ninth exemplary configuration of the first unit 200 and second units 300 according to the present embodiment.

FIG. 12 illustrates a ninth exemplary configuration of the first unit 200 and second units 300 according to the present embodiment. Elements of the first unit 200 and second units 300 in the ninth exemplary configuration that operate in approximately the same manners as operations of the first unit 200 and second units 300 in the third exemplary configuration illustrated in FIG. 6 are given the same symbols, and explanations thereof are omitted. Similar to FIG. 6, FIG. 12 illustrates an exemplary cross-sectional view of the body tube 110 taken along a plane approximately parallel to the Z-X-plane.

The first unit 200 in the ninth exemplary configuration may not be provided with non-vacuum spaces. A wiring substrate 44 is provided between the first partition wall 210 and second partition wall 220 of the first unit 200. The wiring substrate 44 is provided in the body tube 110, and has wires connected to the plurality of electromagnetic optical elements 40, and openings through which individual ones of a plurality of charged particle beams are allowed to pass. That is, the first partition wall 210 may be pasted onto one surface of the wiring substrate 44, and the second partition wall 220 may be pasted onto a surface of the wiring substrate 44 opposite to the first partition wall 210.

In addition, the first unit 200 includes a plurality of cylindrical members 250 that penetrate the first partition wall 210, second partition wall 220, and wiring substrate 44. The cylindrical members 250 may extend from the first unit 200 to the second unit 300. In addition, the second unit 300 may be provided with the electromagnetic optical elements 40 around the cylindrical member 250. FIG. 12 illustrates an example in which the plurality of electromagnetic optical elements 40 are provided to the second unit 300 closer to the charged particle beam sources 20 than the first unit 200 is.

Note that since the second unit 300 serves as vacuum spaces, each of the plurality of electromagnetic optical elements 40 may be housed in a sealed case or the like. Each of the plurality of electromagnetic optical elements 40 may be connected to the wiring substrate 44 of the first unit 200, and supplied with a driving current or the like. In this manner, since the first unit 200 in the ninth exemplary configuration does not have non-vacuum spaces formed between the first partition wall 210 and the second partition wall 220, the first partition wall 210 and second partition wall 220 are not deformed almost at all even if air inside the vacuum spaces in the second unit 300 is exhausted.

By using the first units 200 and second units 300 according to the present embodiment mentioned above, a multi-beam exposure device can be assembled highly precisely at atmospheric pressure. In addition, such a multi-beam exposure device according to the present embodiment allows the optical systems for a plurality of electron beams to operate while they remain positioned in place as in the state where they are positioned in place at atmospheric pressure. Accordingly, the exposure device 100 according to the present embodiment can reduce deformation of partition walls separating vacuum areas and non-vacuum areas, and prevent the precision of drawing of patterns on the sample 10 from lowering.

Various embodiments of the present invention may be described with reference to flowcharts and block diagrams whose blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media.

Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits comprising logical AND, OR, XOR, NAND, NOR, and other logical operations, flip-flops, registers, memory elements, etc., such as field-programmable gate arrays (FPGA), programmable logic arrays (PLA), etc.

Computer-readable storage media may include any tangible device that can store instructions for execution by a suitable device, such that the computer-readable storage medium having instructions stored therein comprises an article of manufacture including instructions which can be executed to create means for performing operations specified in the flowcharts or block diagrams.

Examples of computer-readable media may include an electronic storage medium, a magnetic storage medium, an optical storage medium, an electromagnetic storage medium, a semiconductor storage medium, etc. More specific examples of computer-readable storage media may include a floppy (registered trademark) disk, a diskette, a hard disk, a random access memory (RAM), a read-only memory (ROM), an erasable programmable read-only memory (EPROM or Flash memory), an electrically erasable programmable read-only memory (EEPROM), a static random access memory (SRAM), a compact disc read-only memory (CD-ROM), a digital versatile disk (DVD), a BLU-RAY (registered trademark) disc, a memory stick, an integrated circuit card, etc.

Computer-readable instructions may include assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, JAVA (registered trademark), C++, etc., and conventional procedural programming languages, such as the "C" programming language or similar programming languages.

Computer-readable instructions may be provided to a processor of a general purpose computer, special purpose computer, or other programmable data processing apparatus, or to programmable circuitry, locally or via a local area network (LAN), wide area network (WAN) such as the Internet, etc., to execute the computer-readable instructions to create means for performing operations specified in the flowcharts or block diagrams. Examples of processors include computer processors, processing units, microprocessors, digital signal processors, controllers, microcontrollers, etc.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An exposure device comprising:
   a body tube that is depressurized to produce a vacuum state therein;
   a plurality of charged particle beam sources that are provided in the body tube, and emit a plurality of charged particle beams in a direction of extension of the body tube;
   a plurality of electromagnetic optical elements, each of which is provided corresponding to one of the plurality of charged particle beams in the body tube, and controls the one of the plurality of charged particle beams;

a first partition wall and a second partition wall that are arranged separately from each other in the direction of extension in the body tube, and form non-vacuum spaces between at least parts of the first partition wall and the second partition wall; and a depressurization pump that depressurizes a non-vacuum space that contacts the first partition wall and a non-vacuum space that contacts the second partition wall to an air pressure between zero and atmospheric pressure.

2. The exposure device according to claim 1, wherein the first partition wall and the second partition wall have openings, each of which corresponds to one of the plurality of charged particle beams, and is for allowing passage therethrough of an electron beam.

3. The exposure device according to claim 2, wherein the plurality of electromagnetic optical elements are provided in a depressurized space which is between the first partition wall and the second partition wall and is depressurized by the depressurization pump.

4. The exposure device according to claim 3, wherein the plurality of electromagnetic optical elements and a surface of the first partition wall at which the first partition wall contacts the depressurized space are sealed together by vacuum seals, and the plurality of electromagnetic optical elements and a surface of the second partition wall at which the second partition wall contacts the depressurized space are sealed together by vacuum seals.

5. The exposure device according to claim 2, further comprising:
a third partition wall provided between the first partition wall and the second partition wall; and
a fourth partition wall provided between the third partition wall and the second partition wall, wherein
at least a partial space between the third partition wall and the fourth partition wall has an air pressure higher than air pressures of a space between the first partition wall and the third partition wall and a space between the second partition wall and the fourth partition wall.

6. The exposure device according to claim 1, wherein the first partition wall and the second partition wall are fixed to each other at a plurality of locations other than edge portions.

7. An exposure device comprising:
a body tube that is depressurized to produce a vacuum state therein;
a plurality of charged particle beam sources that are provided in the body tube, and emit a plurality of charged particle beams in a direction of extension of the body tube;
a plurality of electromagnetic optical elements, each of which is provided corresponding to one of the plurality of charged particle beams in the body tube, and controls the one of the plurality of charged particle beams; and
a first partition wall and a second partition wall that are arranged separately from each other in the direction of extension in the body tube, and form non-vacuum spaces between at least parts of the first partition wall and the second partition wall, wherein
the first partition wall and the second partition wall are fixed to each other at a plurality of locations other than edge portions.

8. The exposure device according to claim 7, comprising a plurality of cylindrical members that are provided corresponding to the plurality of charged particle beams, and penetrate the first partition wall and the second partition wall to allow passage therethrough of corresponding charged particle beams, wherein
the first partition wall and the second partition wall are pressed by both sides of each of the plurality of cylindrical members.

9. The exposure device according to claim 8, wherein
a nut is screwed onto at least one end portion of each of the plurality of cylindrical members, and
at least one of the first partition wall and the second partition wall is pressed by the nut.

10. The exposure device according to claim 7, further comprising a plurality of fixation members that penetrate the first partition wall and the second partition wall at a plurality of locations other than edge portions, and press the first partition wall and the second partition wall from both sides.

11. The exposure device according to claim 10, wherein each of the plurality of fixation members has: a bolt that penetrates the first partition wall and the second partition wall; and a nut screwed onto the bolt.

12. The exposure device according to claim 7, wherein the first partition wall and the second partition wall are screwed onto members provided in a space between the first partition wall and the second partition wall at a plurality of locations other than edge portions.

13. The exposure device according to claim 7, further comprising a third partition wall that is arranged separately from the first partition wall in the direction of extension in the body tube, and forms a vacuum space between the third partition wall and the first partition wall, wherein
the first partition wall is pressed toward the second partition wall by a first reinforcing member that is provided between the first partition wall and the third partition wall, and extends in the direction of extension.

14. The exposure device according to claim 7, wherein the plurality of electromagnetic optical elements are arranged between the first partition wall and the second partition wall.

15. An exposure device comprising:
a body tube that is depressurized to produce a vacuum state therein;
a plurality of charged particle beam sources that are provided in the body tube, and emit a plurality of charged particle beams in a direction of extension of the body tube;
a plurality of electromagnetic optical elements, each of which is provided corresponding to one of the plurality of charged particle beams in the body tube, and controls the one of the plurality of charged particle beams; and
a first partition wall and a second partition wall that are arranged separately from each other in the direction of extension in the body tube, wherein
the first partition wall and the second partition wall form at least one non-vacuum space only at a part of a cross-section of the body tube perpendicular to the direction of extension, and form a vacuum space in a remaining portion.

16. The exposure device according to claim 15, wherein at least one non-vacuum space consists of one or more non-vacuum spaces, and each of the plurality of electromagnetic optical elements is arranged in the one or more non-vacuum spaces formed by the first partition wall and the second partition wall.

17. The exposure device according to claim 16, wherein
one of the non-vacuum spaces contacts an inner wall of the body tube, and
each of the one or more non-vacuum spaces is provided with a wire therein that contacts an inner wall of the body tube, and is connected to at least some of the plurality of electromagnetic optical elements.

18. The exposure device according to claim 15, wherein
corresponding to each of a plurality of non-vacuum spaces, each of a plurality of the first partition walls facing the second partition wall is provided, and
at a portion of the second partition wall where the plurality of non-vacuum spaces are not formed, the second partition wall is exposed toward both the plurality of charged particle beam sources and a side opposite to the plurality of charged particle beam sources.

19. The exposure device according to claim 15, wherein
a plurality of spaces are provided between the first partition wall and the second partition wall, and
some of the plurality of spaces are the non-vacuum spaces, and remaining ones of the plurality of spaces are spaces that communicate with a vacuum space at least one of a side closer to the first partition wall or a side closer to the second partition wall.

* * * * *